(12) United States Patent
Tsai et al.

(10) Patent No.: US 9,735,052 B2
(45) Date of Patent: Aug. 15, 2017

(54) METAL LINES FOR INTERCONNECT STRUCTURE AND METHOD OF MANUFACTURING SAME

(71) Applicant: Taiwan Semiconductor Manufacturing Company, Ltd., Hsin-Chu (TW)

(72) Inventors: Cheng-Hsiung Tsai, Miaoli County (TW); Carlos H. Diaz, Mountain View, CA (US); Chung-Ju Lee, Hsinchu (TW); Shau-Lin Shue, Hsinchu (TW); Tien-I Bao, Taoyuan County (TW); Yung-Hsu Wu, Taipei (TW); Hsin-Ping Chen, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/880,379

(22) Filed: Oct. 12, 2015

(65) Prior Publication Data
US 2017/0103915 A1    Apr. 13, 2017

(51) Int. Cl.
*H01L 27/108* (2006.01)
*H01L 23/52* (2006.01)
*H01L 21/768* (2006.01)

(52) U.S. Cl.
CPC .. *H01L 21/76883* (2013.01); *H01L 21/76802* (2013.01); *H01L 21/76829* (2013.01); *H01L 21/76885* (2013.01)

(58) Field of Classification Search
CPC ......... H01L 21/76889; H01L 21/76829; H01L 21/76802; H01L 23/5226; H01L 23/49811; H01L 23/5385; H01L 21/76883
See application file for complete search history.

(56) References Cited

U.S. PATENT DOCUMENTS

| | | | |
|---|---|---|---|
| 7,667,271 B2 | 2/2010 | Yu et al. | |
| 7,880,303 B2 * | 2/2011 | Yu ..................... | H01L 21/76808 257/352 |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |

(Continued)

*Primary Examiner* — Benjamin Sandvik
*Assistant Examiner* — Damon Hillman
(74) *Attorney, Agent, or Firm* — Haynes and Boone, LLP

(57) ABSTRACT

A method for fabricating a semiconductor device includes forming a dielectric layer over a substrate, forming an etch-stop-layer (ESL) over the dielectric layer, forming a first patterned hard mask (HM) defining a first trench over the ESL, forming a second trench extending through the ESL and the dielectric layer. The second trench is adjacent the first trench. The method also includes filling in the first trench and the second trench with a first material layer, extending the first trench through the ESL and the dielectric layer while the first material layer is filled in the second trench to form an extended first trench, forming a first metal line within the extended first trench, forming a capping layer over the first metal line and removing a portion of the first metal line to form a first cut by using the ESL and the first material layer as an etch mask.

20 Claims, 28 Drawing Sheets

(56) References Cited

U.S. PATENT DOCUMENTS

| | | | |
|---|---|---|---|
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,129,906 B2 | 9/2015 | Wu et al. | |
| 2014/0001574 A1 | 1/2014 | Chen et al. | |
| 2014/0061745 A1* | 3/2014 | Myung | H01L 21/743 257/302 |
| 2014/0110755 A1 | 4/2014 | Colinge | |
| 2014/0151812 A1 | 6/2014 | Liaw | |
| 2014/0252428 A1* | 9/2014 | Chang | H01L 29/785 257/288 |
| 2014/0264926 A1* | 9/2014 | Wu | H01L 21/76802 257/774 |
| 2015/0170965 A1* | 6/2015 | Indrakanti | H01L 21/76897 438/666 |
| 2016/0027903 A1* | 1/2016 | Chang | H01L 29/785 438/283 |

* cited by examiner

METAL LINES FOR INTERCONNECT STRUCTURE AND METHOD OF MANUFACTURING SAME

BACKGROUND

The semiconductor integrated circuit (IC) industry has experienced rapid growth. Technological advances in IC design and materials have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play an important role in IC performance. Although existing methods of fabricating IC devices have been generally adequate for their intended purposes, they have not been entirely satisfactory in all respects. For example, challenges rise in cutting a metal line into sub-metal lines.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
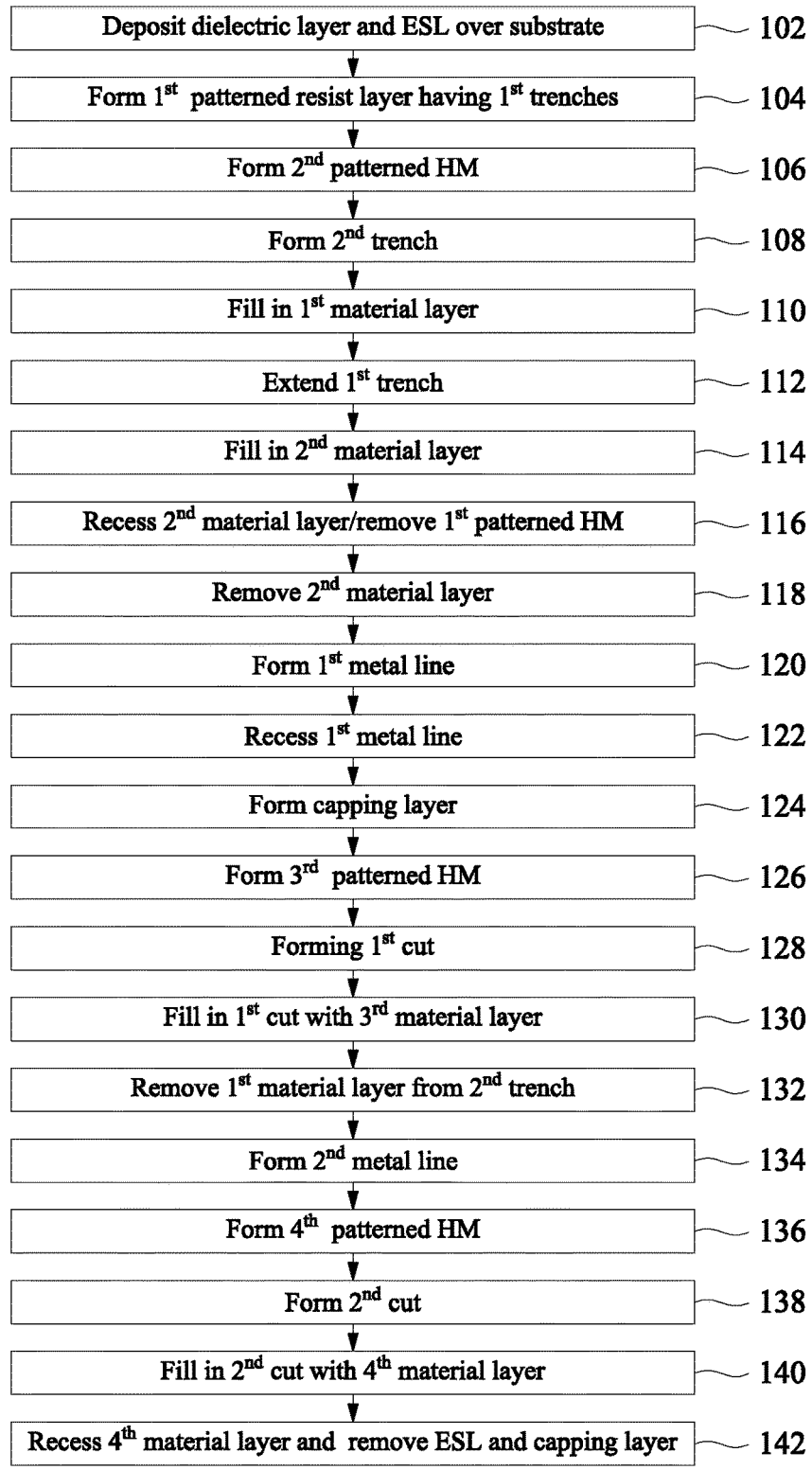
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below with reference a semiconductor device 200, shown in FIGS. 2A through 22B.

Figure 2A:
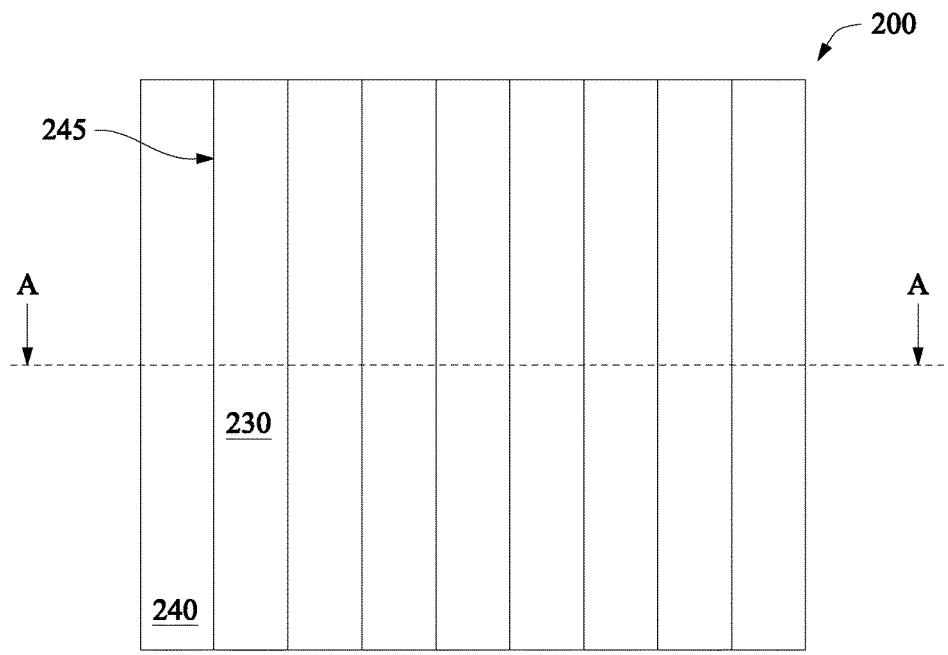
FIGS. 2A, 3A, 4A, 4C, 5A, 6A, 7A, 8A, 9A, 10A, 11A, 12A, 13A, 13C, 14A, 14C, 15A, 16A, 17A, 18A, 19A, 19C, 20A, 20C, 20E, 21A and 22A are top views of an example of a semiconductor device in accordance with some embodiments.
Figure 2B:
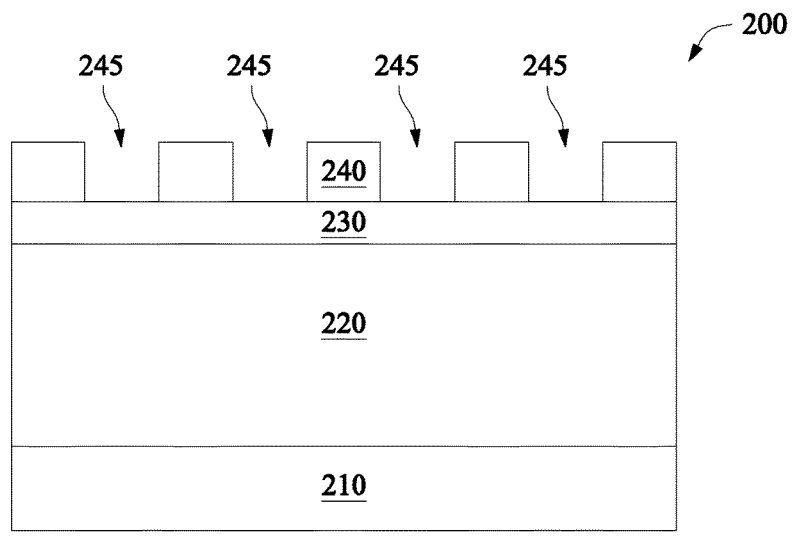
FIGS. 2B, 3B, 4B, 4D, 5B, 6B, 7B, 8B, 9B, 10B, 11B, 12B, 13B, 13D, 14B, 14D, 15B, 16B, 17B, 18B, 19B, 19D, 20B, 20D, 20F, 21B and 22B are cross-sectional views of an example semiconductor device in accordance with some embodiments, along the line A-A in FIGS. 2A, 3A, 4A, 4C, 5A, 6A, 7A, 8A, 9A, 10A, 11A, 12A, 13A, 13C, 14A, 14C, 15A, 16A, 17A, 18A, 19A, 19C, 20A, 20C, 20E, 21A and 22A, respectively.

Referring to FIGS. 1, 2A, and 2B, method 100 begins at step 102 by depositing a dielectric layer 220 over a substrate 210 and depositing an etch-stop-layer (ESL) 230 over the dielectric layer 220. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various p-type doped regions and/or n-type doped regions, implemented by a process such as ion implantation and/or diffusion. Those doped regions include n-well, p-well, light doped region (LDD), doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit.

The dielectric layer 220 may include silicon oxide, silicon nitride, a dielectric material layer having a dielectric constant (k) lower than thermal silicon oxide (therefore referred to as low-k dielectric material layer), and/or other suitable dielectric material layer. The dielectric layer 220 may include a single layer or multiple layers. The ESL 230 may include silicon nitride, silicon carbide, titanium oxide, titanium nitride, tantalum oxide, tantalum nitride, and/or any suitable materials. The ESL 230 may include a material which is different from the dielectric layer 220 to achieve etching selectivity during subsequent etch processes. Dielectric layer 220 and ESL 230 may be deposited by various methods, including PVD, CVD, ALD, spin-on coating, and/or other methods.

Referring again to FIGS. 1, 2A, and 2B, method 100 proceeds to step 104 by forming a first patterned hard mask (HM) 240 over the ESL 230. The first patterned HM 240 may include silicon oxide, silicon nitride, oxynitride, silicon carbide, titanium oxide, titanium nitride, tantalum oxide, tantalum nitride, and/or any other suitable material. The first patterned HM 240 may include a material which is different from the ESL 230 and the dielectric layer 220 to achieve etching selectivity during subsequent etch processes. In the present embodiment, the first patterned HM 240 has a plurality of first trenches 245 such that the ESL 230 is exposed within the first trenches 245. The first patterned HM 240 may be formed by deposition, lithography patterning and etch processes.

Figure 3A:
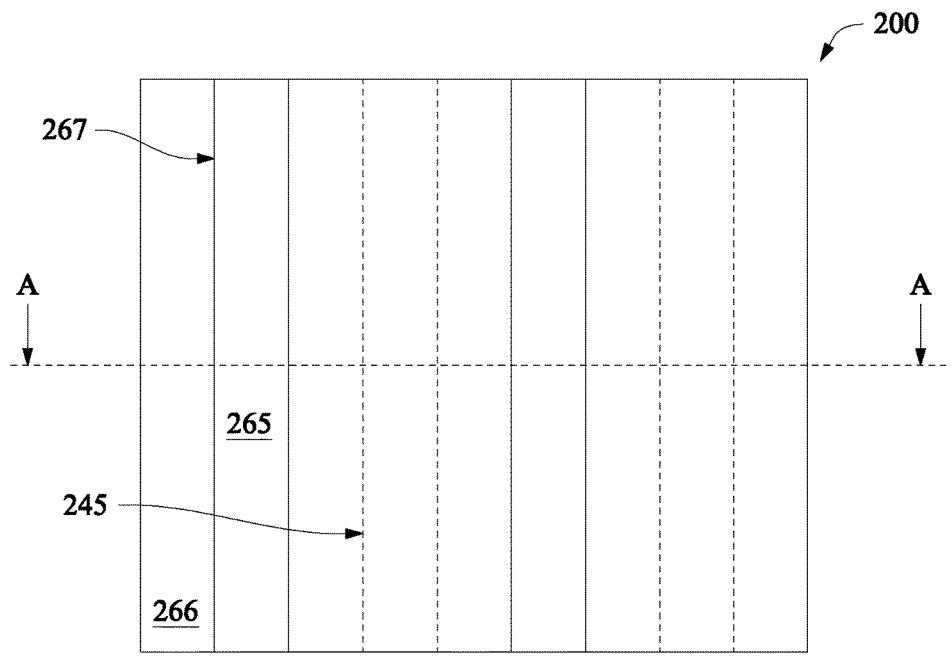
Figure 3B:
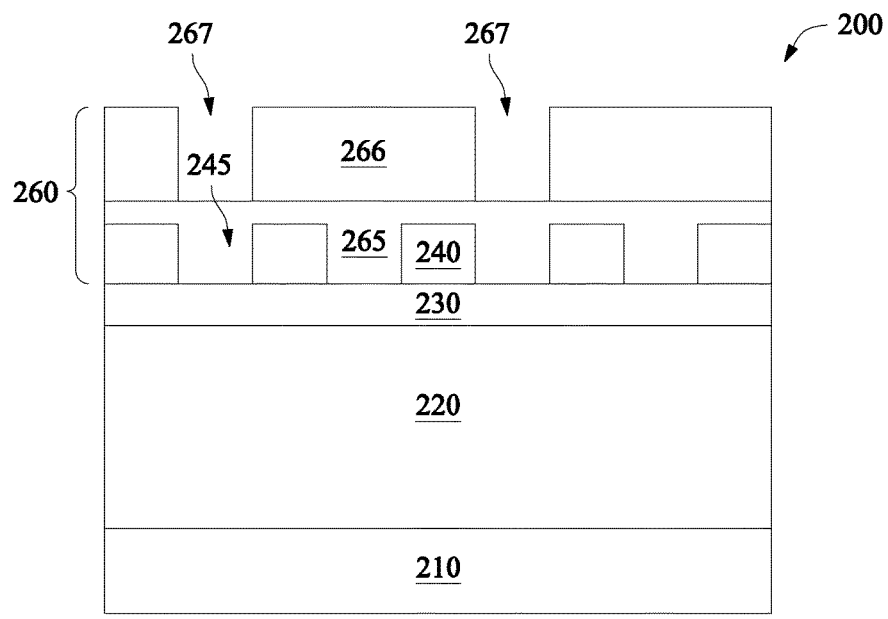

Referring to FIGS. 1, 3A, and 3B, method 100 proceeds to step 106 by forming a second patterned HM 260 over the first patterned HM 240 to define second trenches. In some embodiments, the second patterned HM 260 is formed by depositing a sacrifice layer 265 over the first patterned HM 240, including filling in the first trenches 245, and forming a first patterned photoresist layer 266 over the sacrifice layer 265. The sacrifice layer 265 may include anti-reflection layer, organic polymer layer, silicon-containing layer, and/or other suitable material. The sacrifice layer 265 may include multiple layers. The sacrifice layer 265 may be formed by CVD, spin-on coating, and/or other suitable technique.

The first patterned photoresist layer 266 has a plurality of first openings 267, which align with a subgroup of the first trenches 245. The first patterned photoresist layer 266 may be formed by lithography process. An exemplary lithography process may include forming a photoresist layer, exposing the photoresist layer by a lithography exposure process, performing a post-exposure bake process, and developing the photoresist layer to form the patterned resist layer.

Figure 4A:
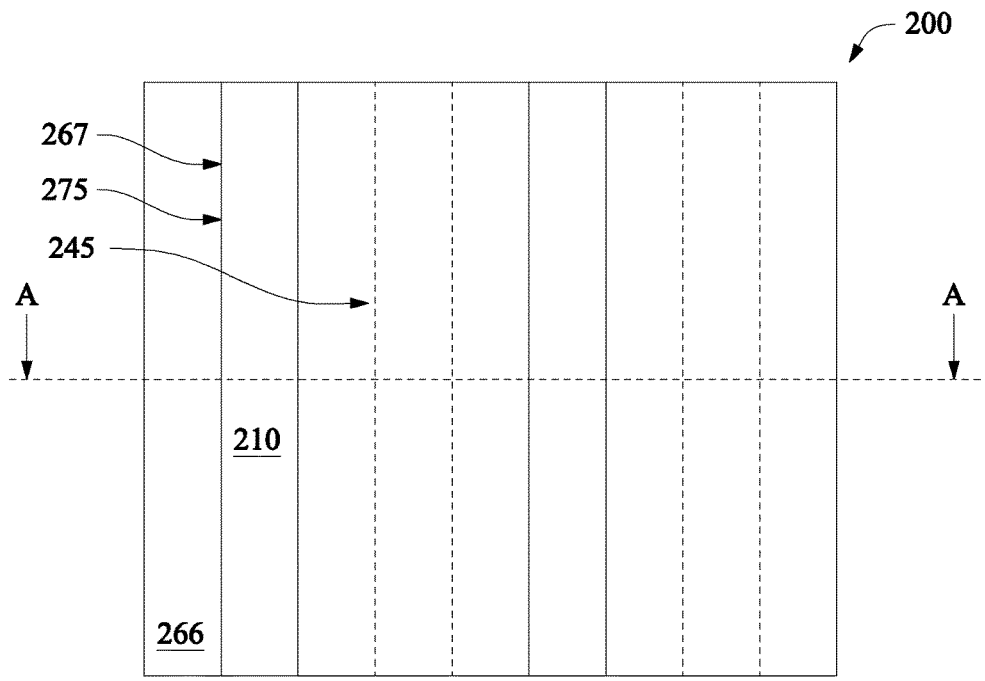
Figure 4B:
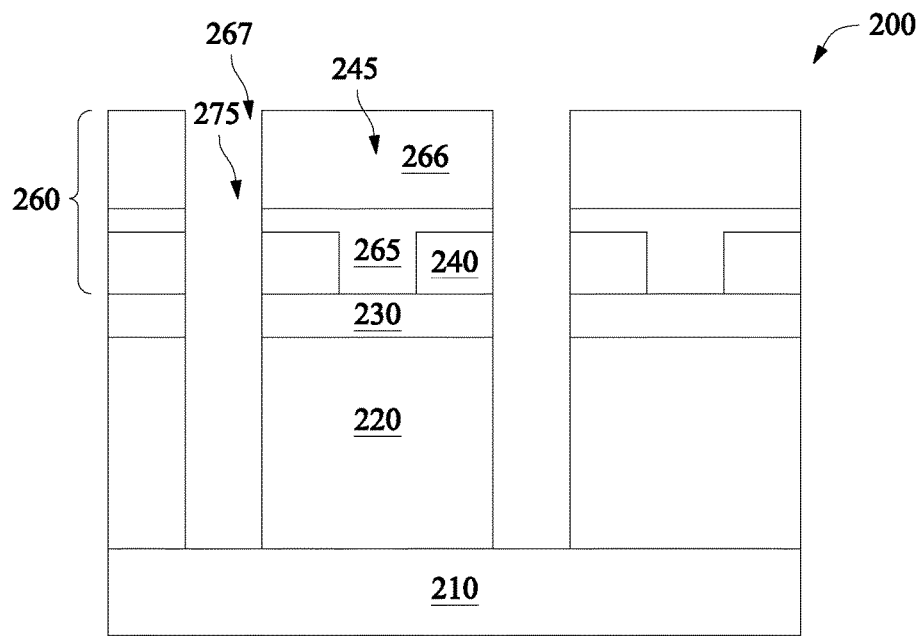
Figure 4C:
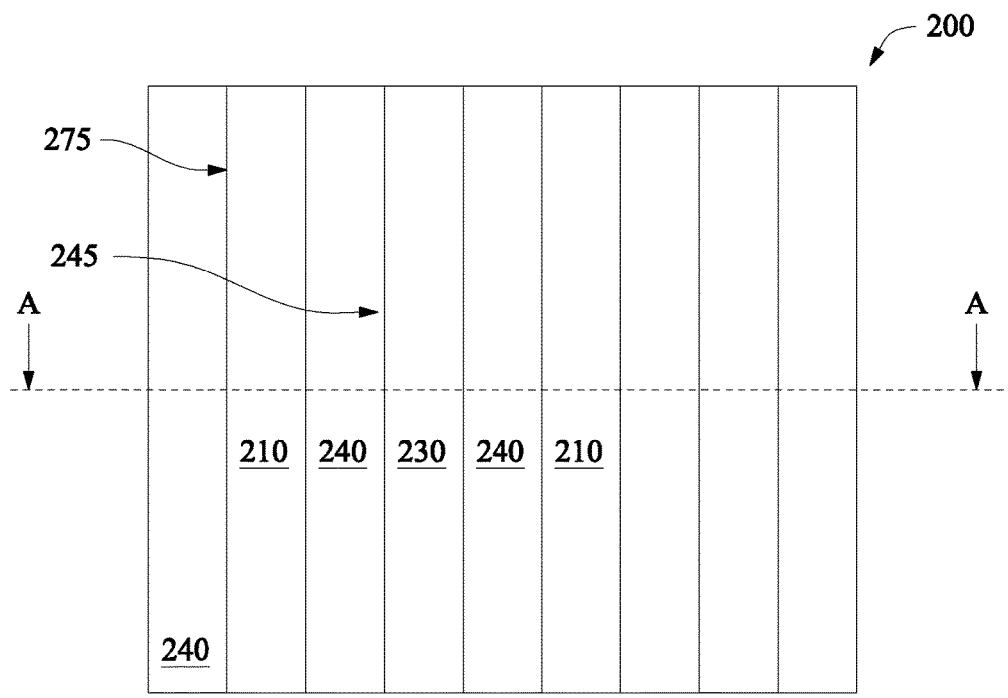
Figure 4D:
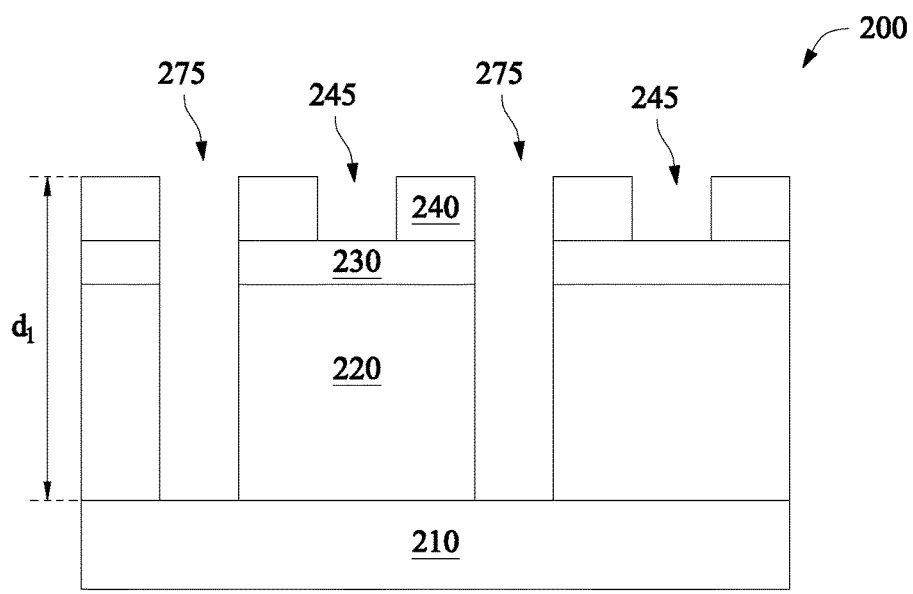

Referring to FIGS. 1, 4A, and 4B, method 100 proceeds to step 108 by forming second trenches 275, which extend through the dielectric layer 220. In some embodiments, sacrifice layer 250, ESL layer 230 and dielectric layer 220 are etched through the first opening 267 to form second trenches 275. The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The etch process may include a multiple-step etching to gain etch selectivity, flexibility and desired etch profile. After forming second trenches 275, the remaining portions of the patterned photoresist layer 266 and the sacrifice layer 265 are removed by another etch process, such as by a wet stripping and/or plasma ashing, as shown in FIGS. 4C-4D. As shown, second trenches 275 extend through dielectric layer 220 to expose a portion of substrate 210 and have a first depth $d_1$. Additionally, a subset of first trenches 245 remain after the remaining portions of the patterned photoresist layer 266 and the sacrifice layer 265 are removed.

Figure 5A:
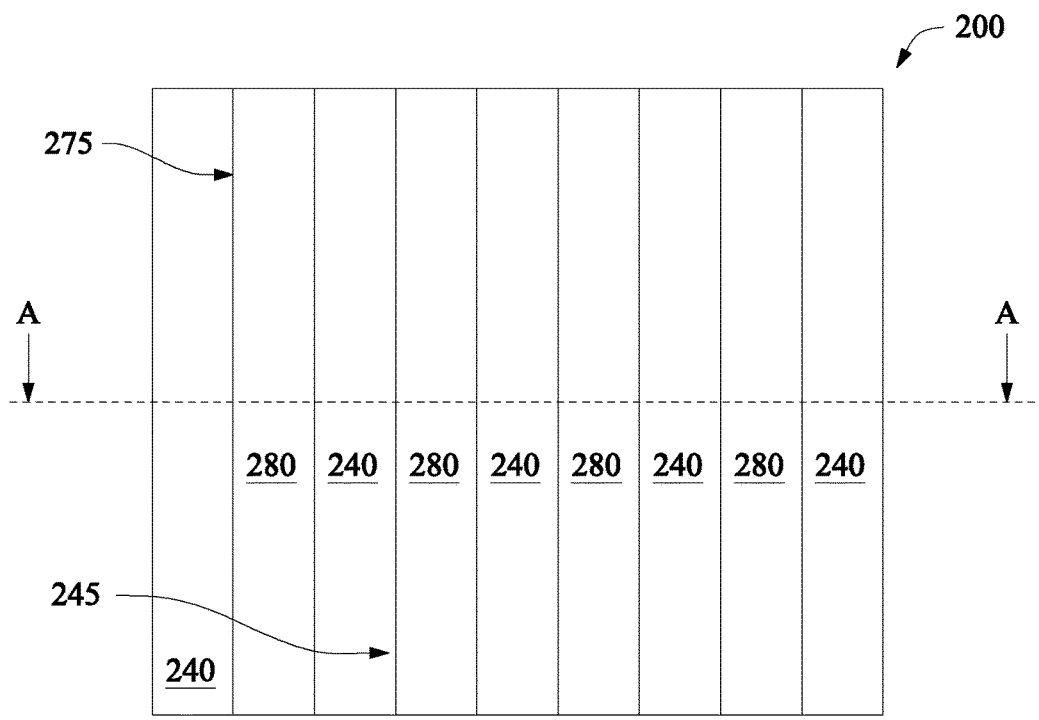
Figure 5B:
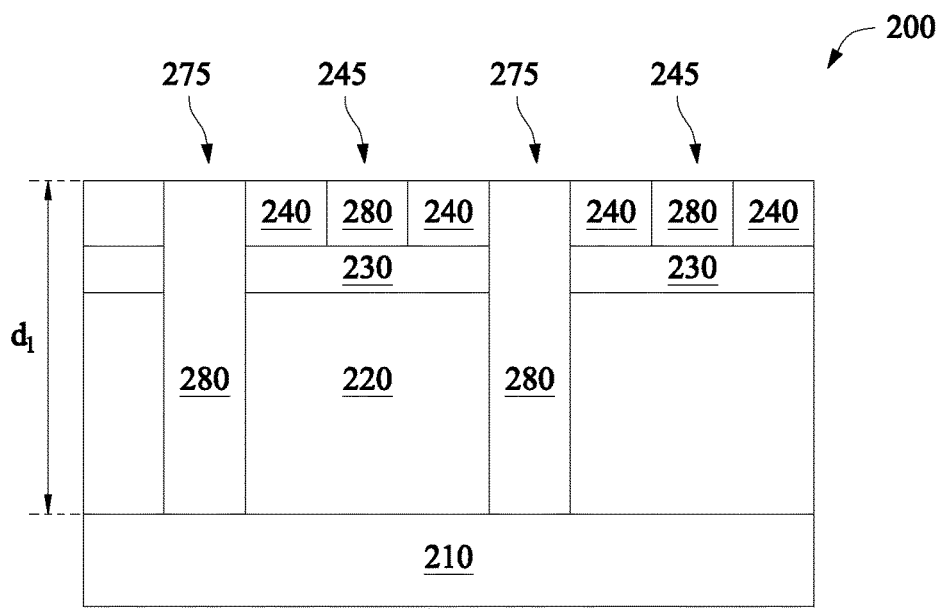

Referring to FIGS. 1, 5A, and 5B, method 100 proceeds to step 110 by filling the first trenches 245 and second trenches 275 with a first material layer 280. The first material layer 280 may include silicon oxide, silicon nitride, oxynitride, silicon carbide, titanium oxide, titanium nitride, tantalum oxide, tantalum nitride, and/or any suitable materials. The first material layer 280 may include a material which is different from the first patterned HM 240, the ESL 230 and the dielectric layer 220 to achieve etching selectivity during subsequent etch processes. In one embodiment, the first material layer 280 includes titanium nitride, while the first patterned HM 240 includes tantalum nitride, the ESL layer 230 includes silicon nitride and the dielectric layer 220 includes silicon oxide. The first material layer 280 may be deposited by CVD, PVD, ALD, spin-on coating, and/or other suitable technique. In the present embodiment, the first material layer 280 is recessed by a CMP process to expose the first patterned HM 240 after deposition of the first material layer 280.

Figure 6A:
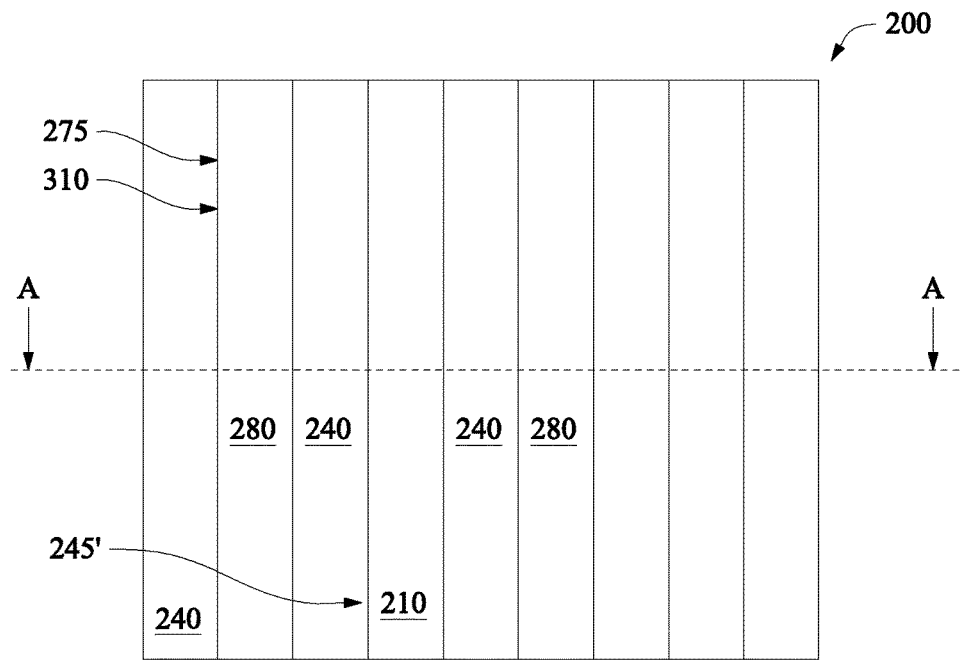
Figure 6B:
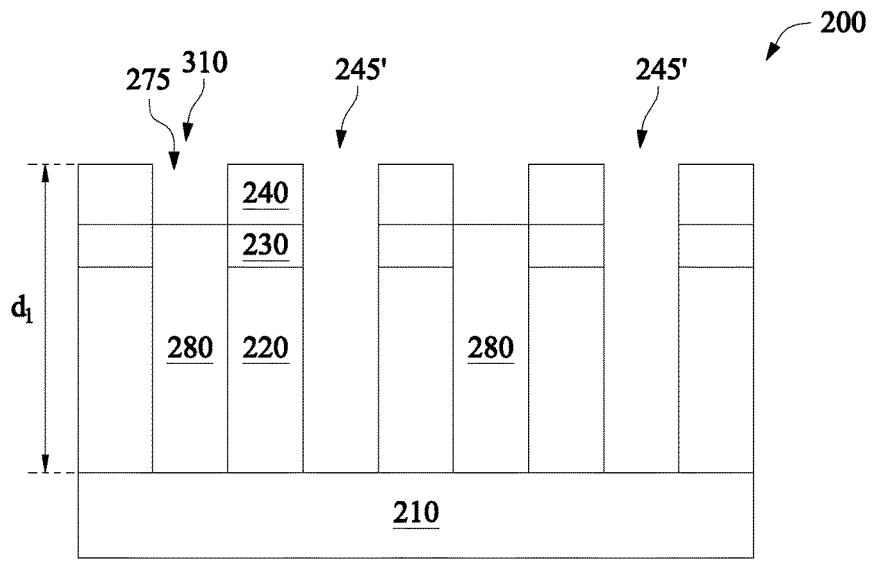

Referring to FIGS. 1, 6A, and 6B, method 100 proceeds to step 112 by extending the first trench 245 through the ESL 230 and the dielectric layer 220. As a result, the extended first trenches 245' have the same depth as the second trench 275, namely $d_1$.

In an embodiment, extended first trenches 245' are formed by performing a first etch process to remove the first material layer 280 in the first trench 245. Additionally, a portion of the first material layer 280 in the second trench 275 is removed as well and leaves a first sub-trench 310 within the second trench 275. In the some embodiments, the first material layer 280 is etched by a selective etch such that the etch process etches the first material layer 280 without substantially etching the first patterned HM 240. Thus, the first patterned HM 240 serves as an etch mask and the first material layer 280 is etched with a self-alignment nature.

After removing the first material layer 280 in the first trench 245, a second etches process is performed to etch the ESL 230 and the dielectric layer 220 to form extended first trenches 245'. In some embodiments, the second etch process is a second selective etch such that the second etch process etches the ESL 230 and the dielectric layer 220 without substantially etching the first patterned HM 240 and first material layer 280. Thus, the extended first trench 245' is formed with a self-alignment nature. As shown, the first material layer 280 protects the second trenches 275 during the second etch process. Above selective etch processes with a self-alignment nature provide process simplicity and relaxes process constrains. The selective etches may include a selective wet etch, a selective dry etch, and/or a combination thereof.

Figure 7A:
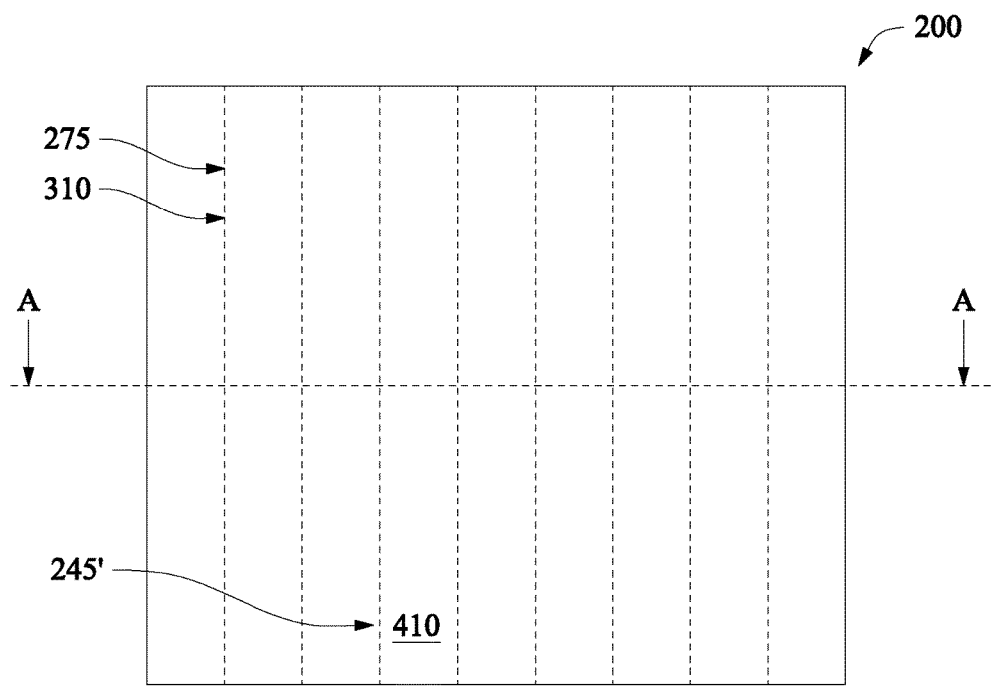
Figure 7B:
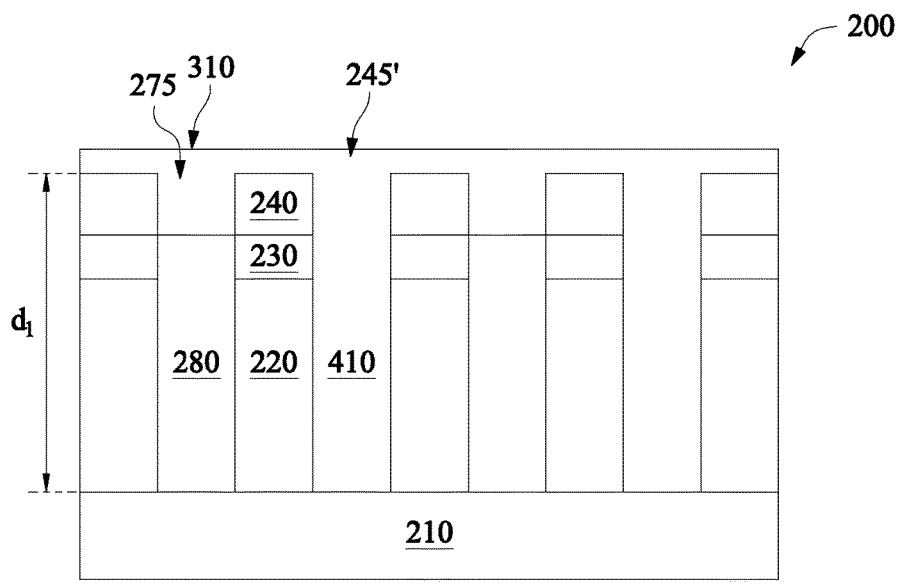

Referring to FIGS. 1, 7A, and 7B, method 100 proceeds to step 114 by filling in the first sub-trench 310 and the extended first trench 245' with a second material layer 410. The second material layer 410 may include silicon oxide, silicon nitride, oxynitride, silicon carbide, titanium oxide, titanium nitride, tantalum oxide, tantalum nitride, and/or any suitable materials. In the present embodiment, the second material layer 410 may include a material which is different from the first material layer 280 to achieve etching selectivity during subsequent etch processes. The second material layer 410 may be deposited by CVD, ALD, spin-on coating, and/or other proper technique.

Figure 8A:
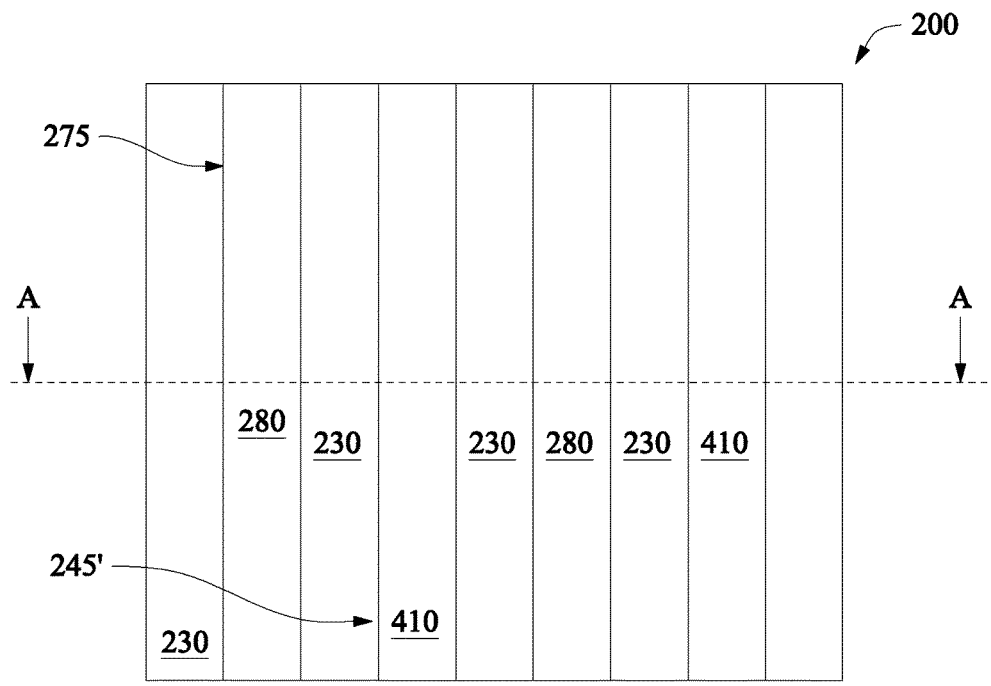
Figure 8B:
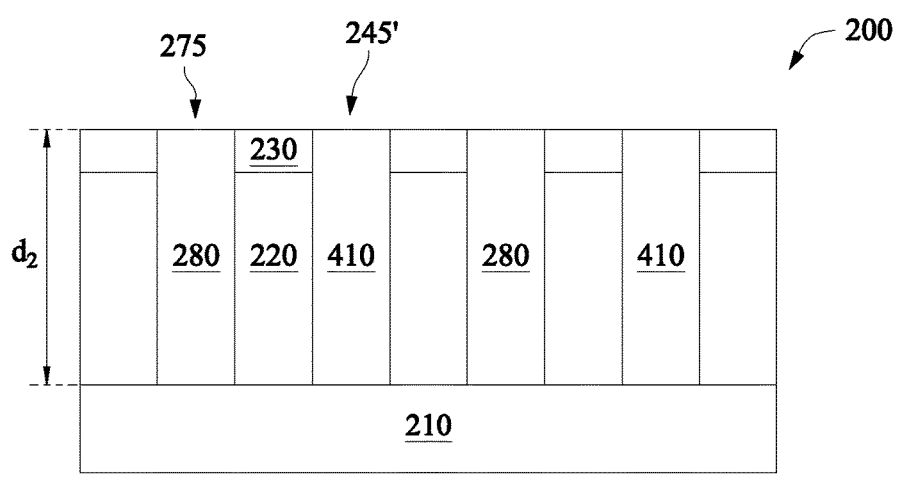

Referring to FIGS. 1, 8A, and 8B, method 100 proceeds to step 116 by recessing the second material layer 410 and removing the first patterned HM 240 to reduce the trench depth of both the extended first trenches 245' and second trenches 275, from the first depth $d_1$ to a second depth $d_2$. With reducing trench depth, challenges in subsequent gap-filling process are reduced. As shown, the first material layer 280 is exposed within the second trenches 275 and the second material layer 410 is exposed within the extended first trenches 245'. In one embodiment, the recess process is a CMP process.

Figure 9A:
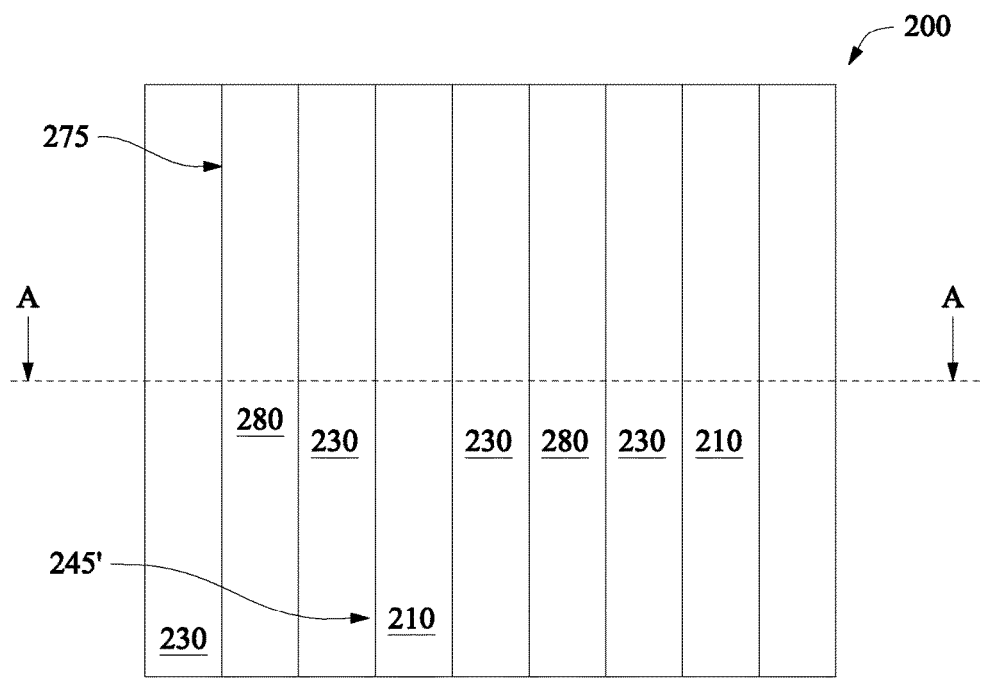
Figure 9B:
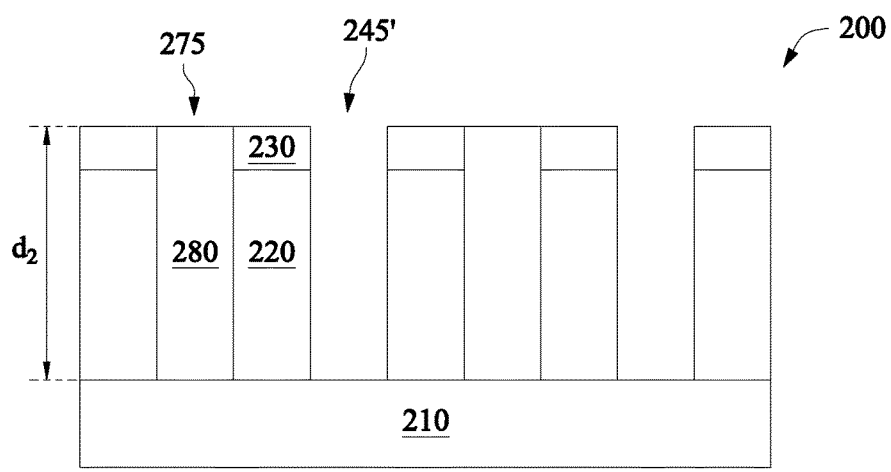

Referring to FIGS. 1, 9A, and 9B, method 100 proceeds to step 118 by removing the second material layer 410 from the extended first trench 245'. In the present embodiment, the second material layer 410 is removed by a selective etch such that the etch process etches the second material layer 410 without substantially etching the ESL 230 and the first material layer 280. The selective etch process provides process simplicity and relaxes process constrains. The selective etch may include a selective wet etch, a selective dry etch, and/or a combination thereof.

Figure 10A:
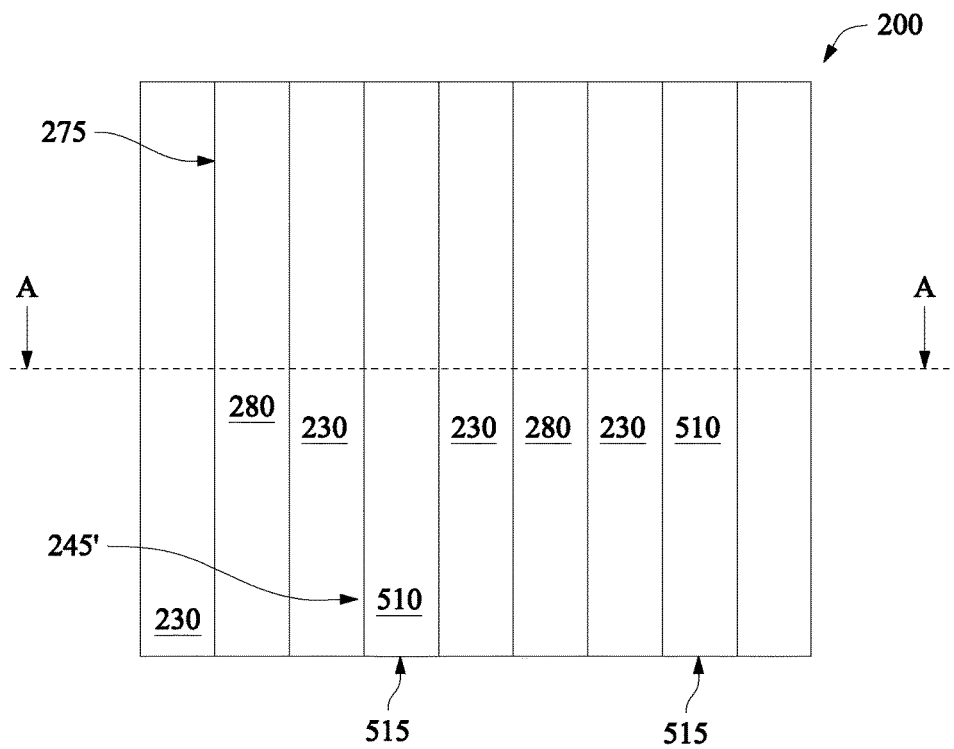
Figure 10B:
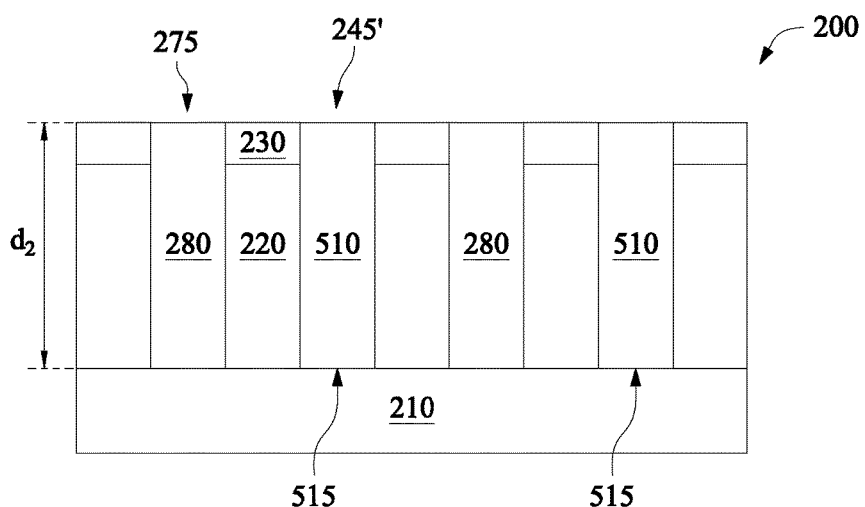

Referring to FIGS. 1, 10A, and 10B, method 100 proceeds to step 120 by filling in the extended first trench 245' with a first metal layer 510. As has been mentioned previously, after reducing the depth of the extended first trench 245' from $d_1$ to $d_2$, challenges in gap-filling process of filling the extended first trench 245' with the first metal layer 510 are reduced. The first metal layer 510 may include copper (Cu), cobalt (Co), tungsten (W), ruthenium (Ru), silver (Ag), gold (Au), cobalt tungsten (CoW), cobalt silicon (CoSi), or other suitable metals. The first metal layer 510 may be deposited by PVD, CVD, metal-organic chemical vapor deposition (MOCVD, and/or other suitable technique. In the present embodiment, a CMP process is performed to remove the excessive first metal layer 510 and expose the first material layer 280 in the second trenches 275. As shown, first metal layer 510 in the extended first trench 245' forms a first metal line 515.

Figure 11A:
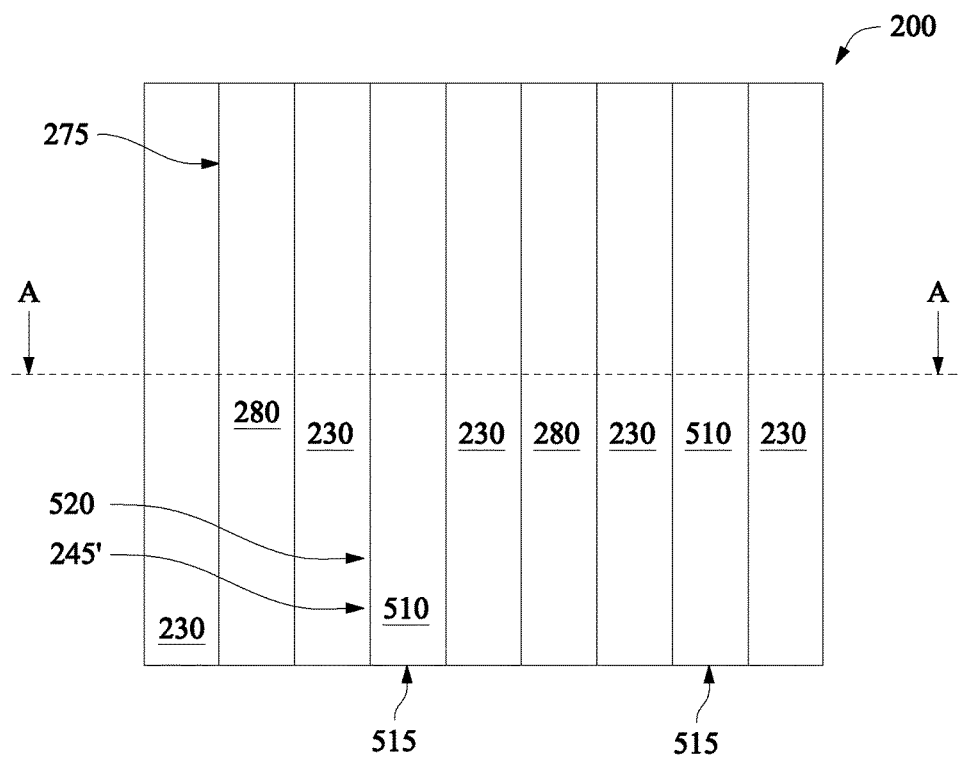
Figure 11B:
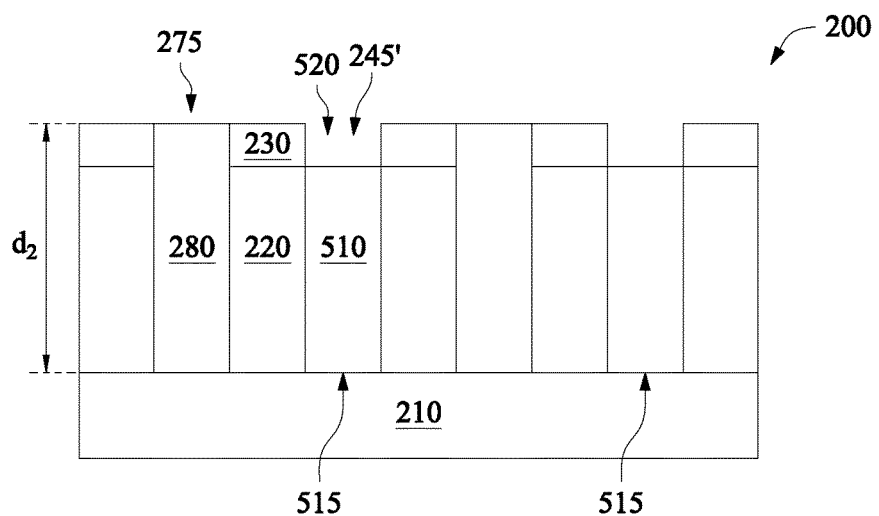

Referring to FIGS. 1, 11A, and 11B, method 100 proceeds to step 122 by recessing the first metal line 515 to form a second sub-trench 520 within the extended first trench 245'. The first metal line 515 may be recessed by a selective etch such that the etch process etches the first metal layer 510 without substantially etching the ESL 230 and the first material layer 280. The selective etch process provides process simplicity and relaxes process constrains. The selective etch may include a selective wet etch, a selective dry etch, and/or a combination thereof.

Figure 12A:
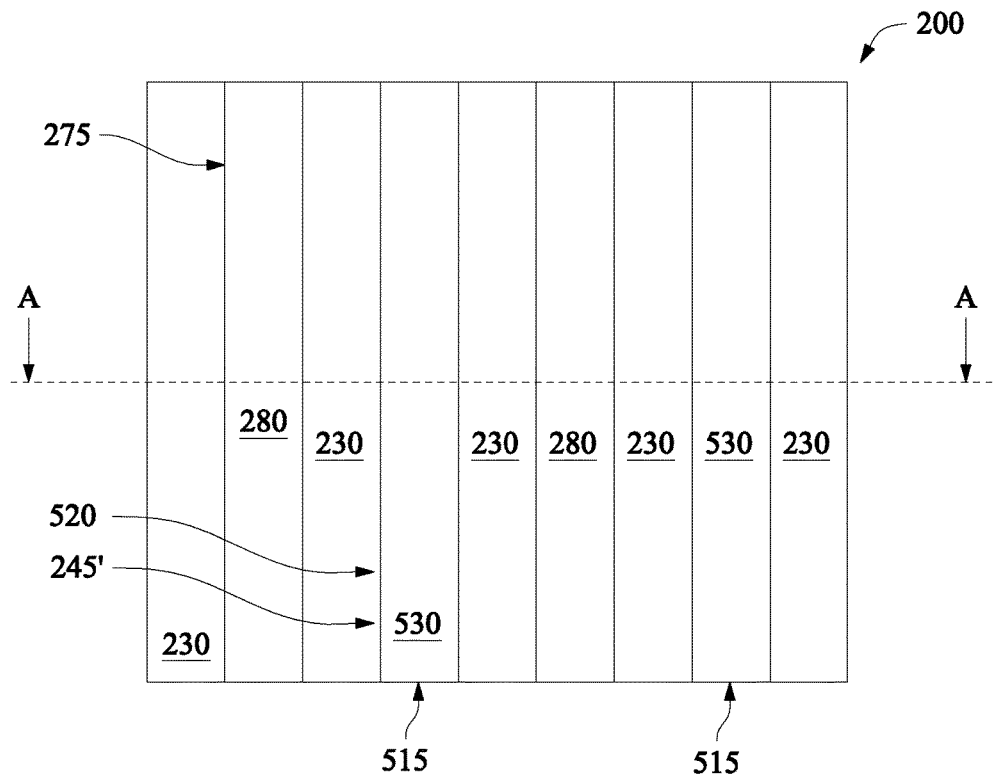
Figure 12B:
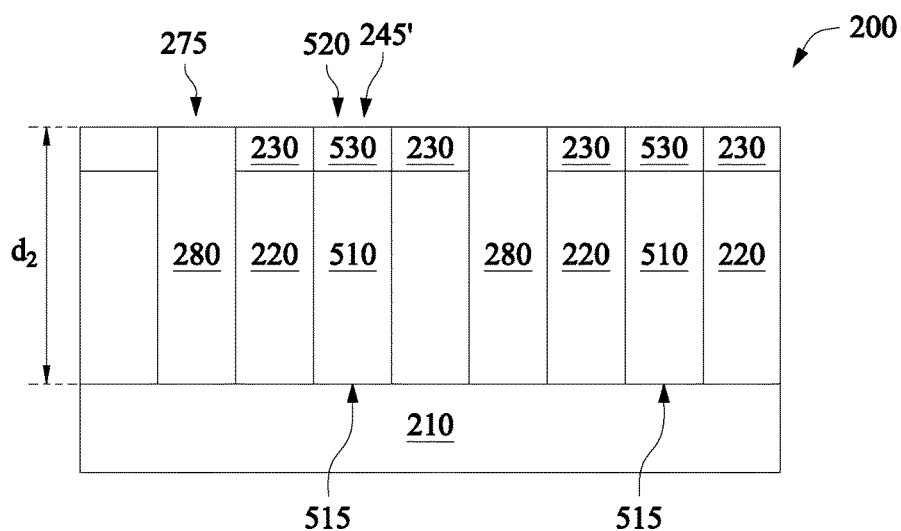

Referring to FIGS. 1, 12A, and 12B, method 100 proceeds to step 124 by forming a capping layer 530 over the recessed first metal line 515 within the second sub-trench 520 of extended first trench 245'. The capping layer 530 may include silicon oxide, silicon nitride, oxynitride, silicon carbide, titanium oxide, titanium nitride, tantalum oxide, tantalum nitride, and/or any suitable materials. In the present embodiment, the capping layer 530 may include a material which is different from the ESL 230 and the first material layer 280 to achieve etching selectivity during subsequent etch processes. The capping layer 530 may be deposited by CVD, ALD, MOCVD, spin-on coating, and/or other suitable technique. A CMP process is performed to remove the excessive capping layer 530 and expose the ESL 230 and the first material layer 280.

Figure 13A:
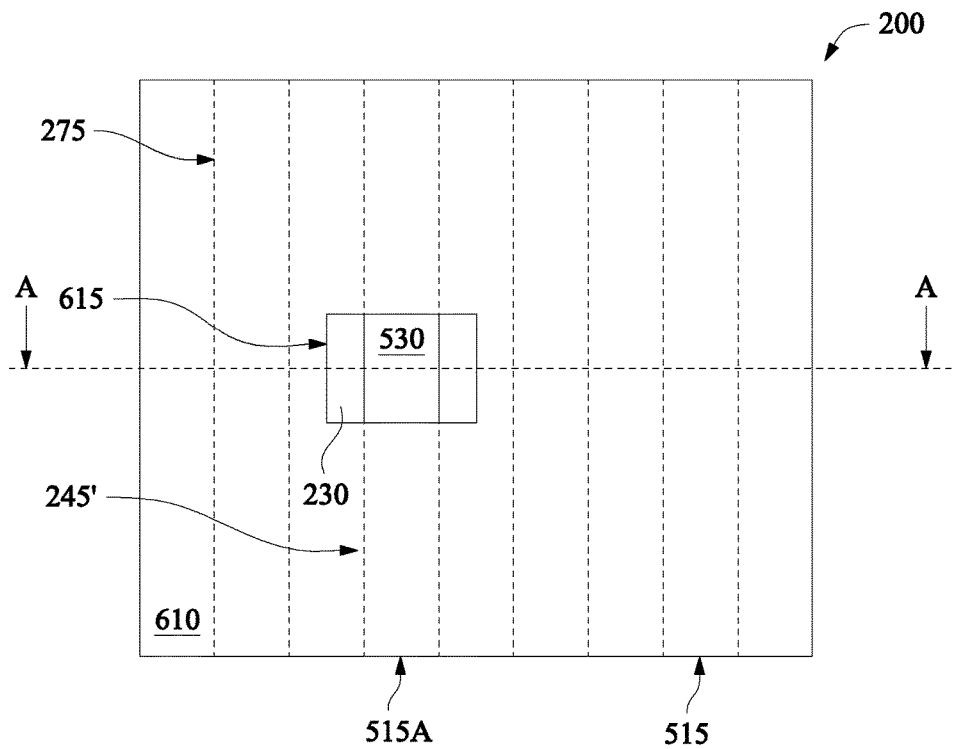
Figure 13B:
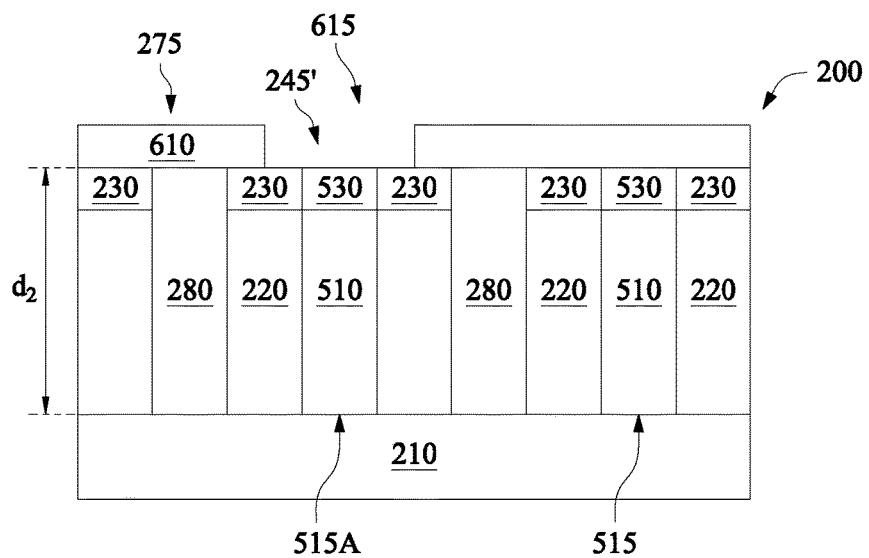

Referring to FIGS. 1, 13A, and 13B, method 100 proceeds to step 126 by forming a third patterned HM 610 over the ESL 230, the first material layer 280 and the capping layer 530. The third patterned HM 610 has a second opening 615 to expose a portion of the capping layer 530 on top of a designated first metal line 515, referred to as 515A. In one embodiment, the third patterned HM 610 is a patterned photoresist layer formed by a procedure including coating, exposure, post exposure baking, and developing. In another embodiment, the third patterned HM 610 is formed by depositing a HM layer over the ESL 230, the first material layer 280 and the capping layer 530, depositing photoresist layer over the HM layer, patterning the photoresist layer, and then etching the HM layer through patterned photoresist layer to pattern the HM layer. The HM layer may include oxide, silicon nitride, and/or other suitable material, deposited by CVD, PVD, spin-on coating, and/or other proper technique.

Figure 13C:
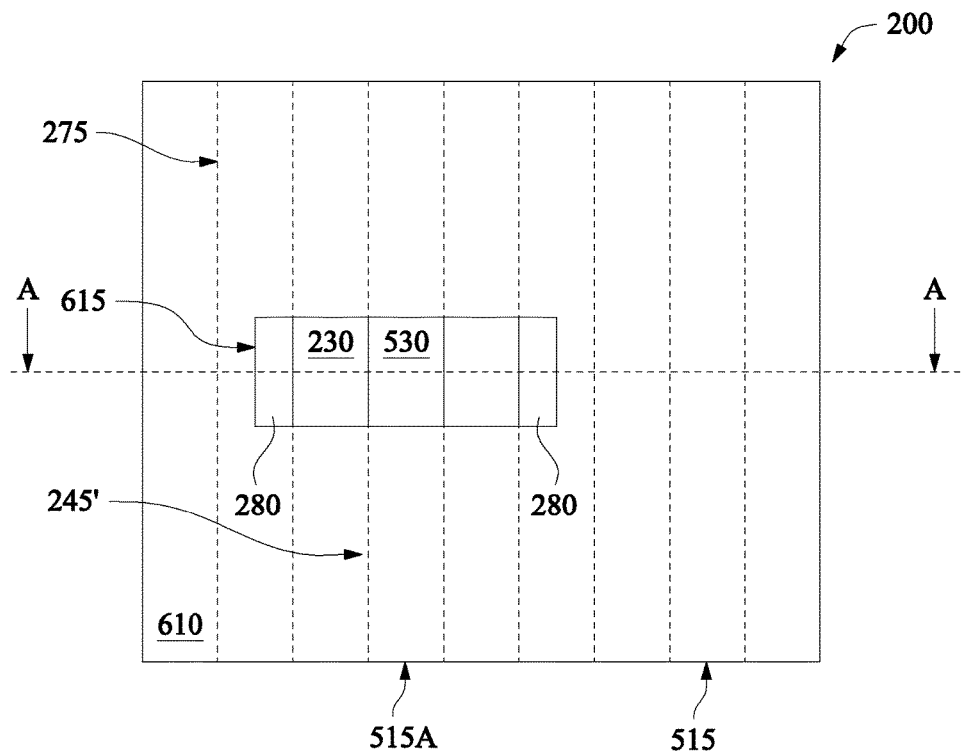
Figure 13D:
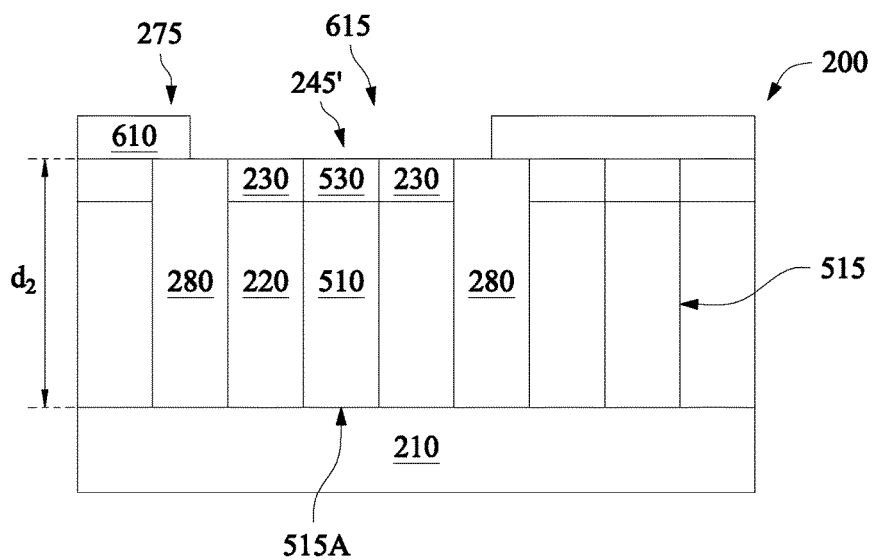
Figure 14A:
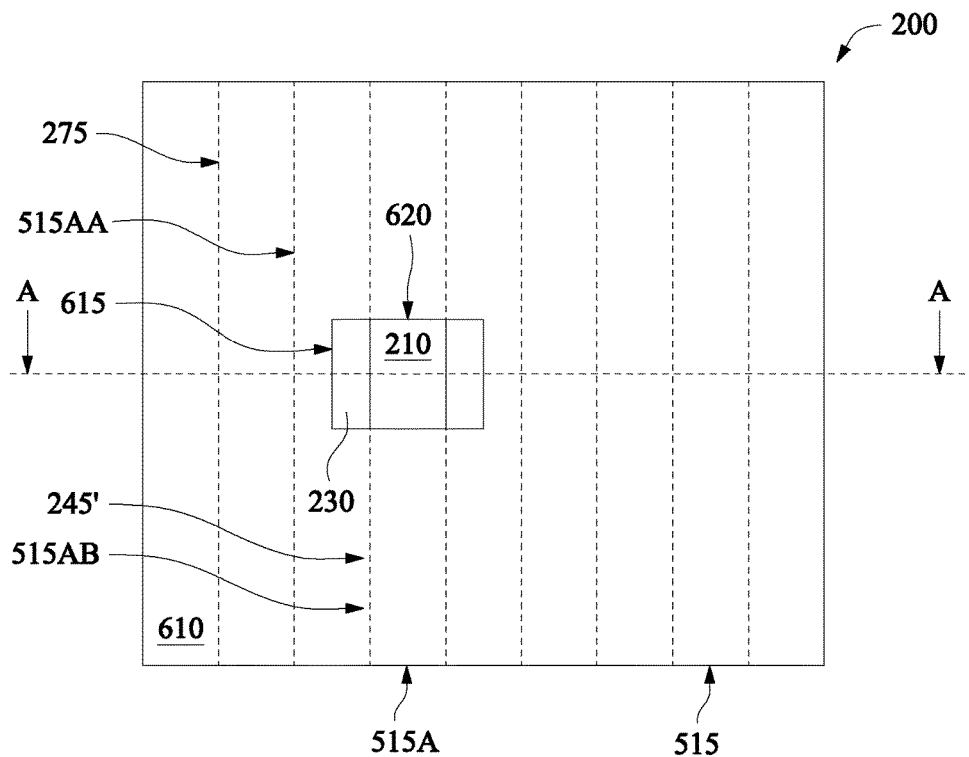
Figure 14B:
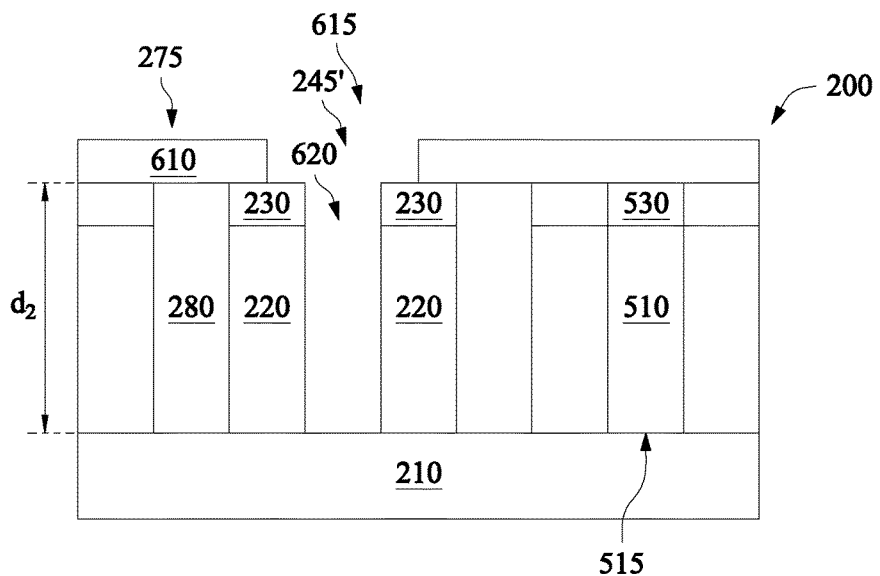
Figure 14C:
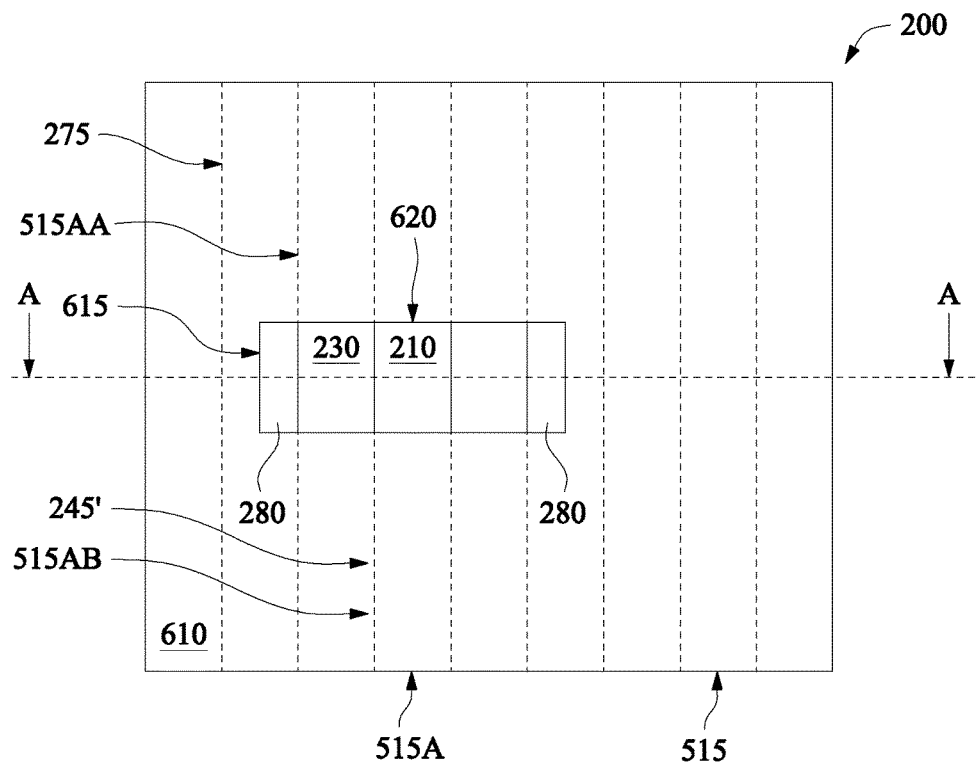
Figure 14D:
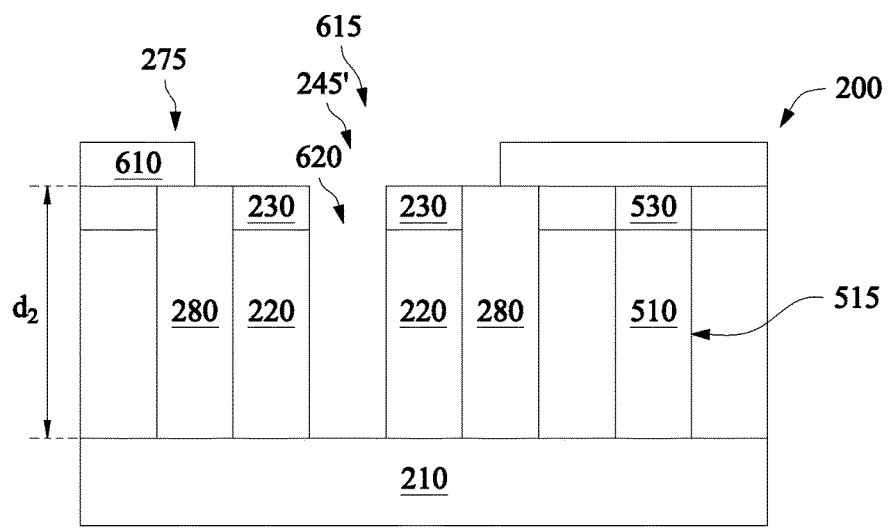

In some embodiments, not only the portion of the capping layer 530 (over the first metal line 515A) is exposed within the second opening 615, but also an adjacent ESL 230 is exposed in the same second opening 615, as shown in FIGS. 13A and 13B. In some embodiments, the second opening 615 extends to the adjacent second trench 275 such that portions of the first material layer 280 are also exposed in the same second opening 615, as shown in FIGS. 13C-13D. Sometimes, it is designed that the second opening 615 having a larger width than a width of the first metal line 515A to obtain advantages, such as relaxing lithography process resolution constrains.

Referring to FIGS. 1 and 14A-14D, method 100 proceeds to step 128 by etching the capping layer 530 and the first metal layer 510 through the second opening 615 to form a first cut 620. As shown, the first metal line 515A is cut into two first sub-metal lines, 515AA and 515AB. In the present embodiment, the etch process is chosen to selectively etch the capping layer 530 and the first metal layer 510 without substantially etching the ESL 230 and the first material layer 280. As shown, for circumstances where the adjacent ESL 230 is exposed in the same second opening 615(as shown in FIGS. 13A-13B), or both of the ESL 230 and the first material layer 280 are exposed within the same second opening 615(as shown in FIGS. 13D-13E), the exposed portions of the ESL 230 and the first material layer 280 serve as a sub-etch-mask.

The etch process may include a wet etch, a dry etch, and/or a combination thereof. In some embodiments, a reactive ion etching (RIE) is performed with etch gas of CxHy, CxFy, CxHyFz, or combinations thereof. The subscript x, y or z has a value greater than 0 and less than 6. In some embodiments, a wet etch process may be alternatively or additionally used. The corresponding etchant may include a mix of HCl, $FeCl_3$ and/or $H_2O$.

Figure 15A:
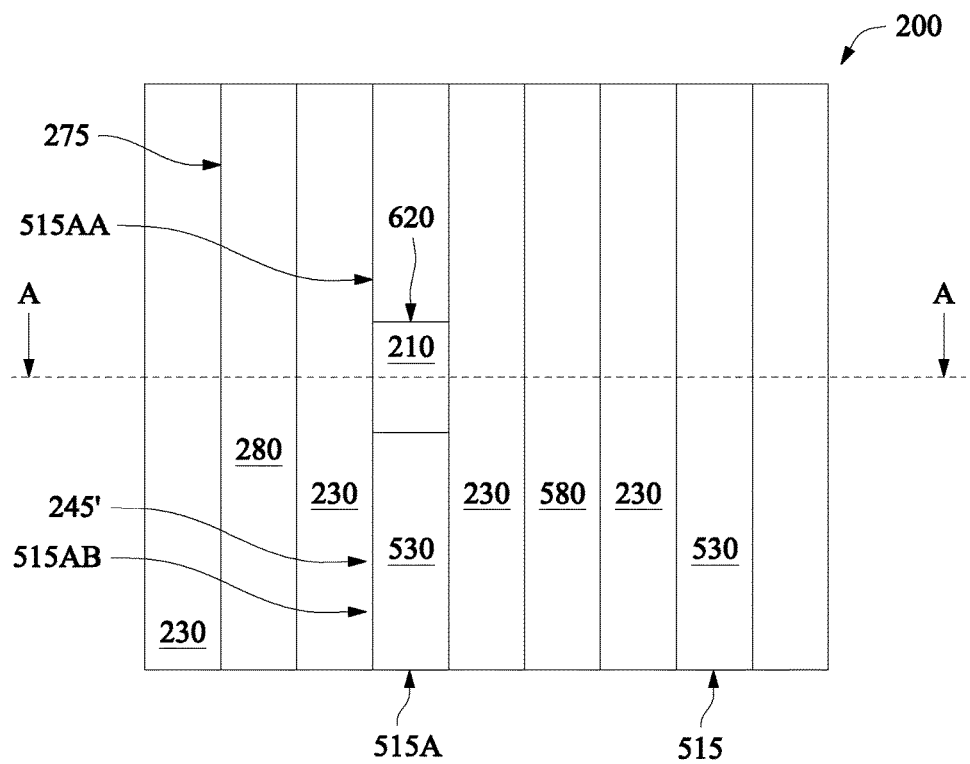
Figure 15B:
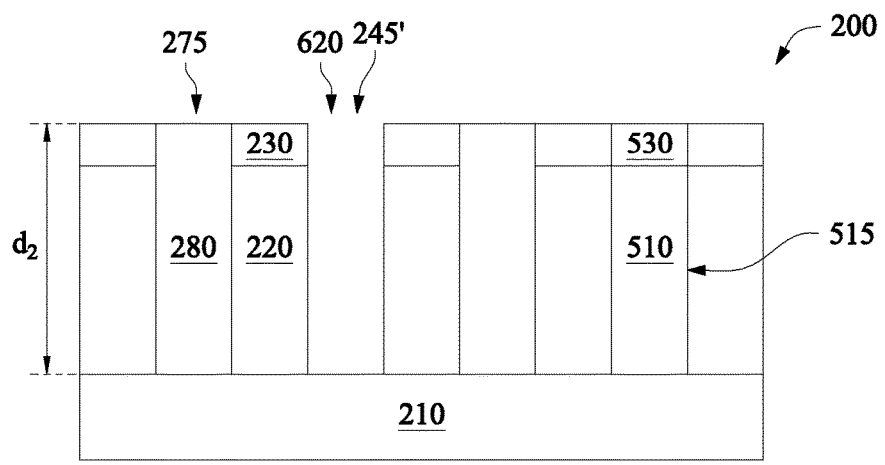

Referring to FIGS. 15A and 15B, after forming the first cut 620, the third patterned HM 610 is removed by an etch process. In one example where the third patterned HM 610 is a photoresist pattern, the third HM 610 is removed by wet stripping and/or plasma ashing. As shown, the first metal line 515A is cut into two first sub-metal lines, 515AA and 515AB, that are separated from each other by the first cut 620.

Figure 16A:
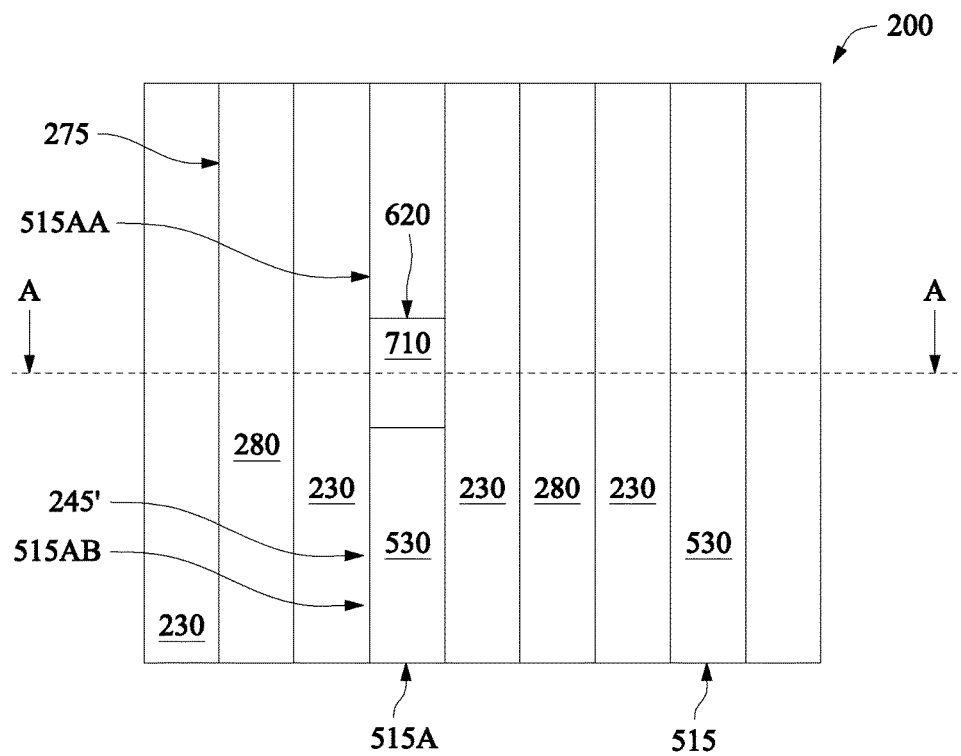
Figure 16B:
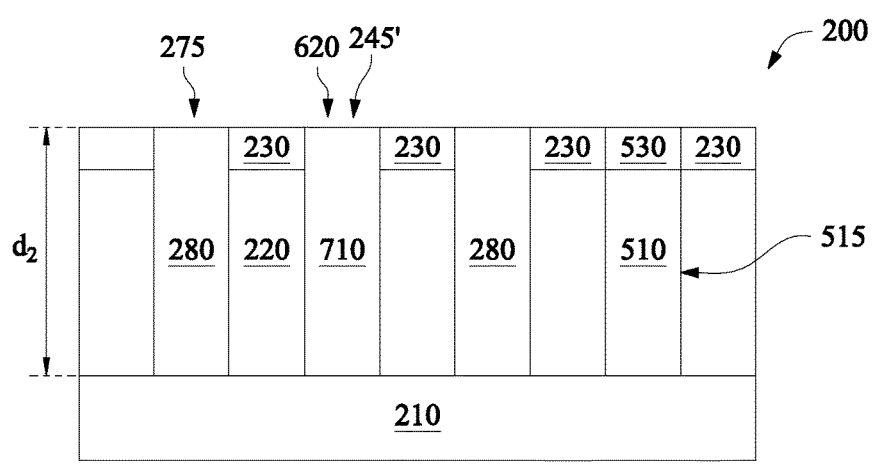

Referring to FIGS. 1, 16A, and 16B, method 100 proceeds to step 130 by filling in the first cut 620 with a third material layer 710. The third material layer 710 may include spin-on glass, silicon oxide, silicon nitride, oxynitride, silicon carbide, and/or other suitable materials. In one embodiment, the third material layer 710 includes a material which is different from the first material layer 280 and the ESL 230 to achieve etching selectivity in subsequent etches. The third material layer 710 may be deposited by CVD, PVD, ALD, spin-on coating, or other suitable techniques. A CMP process is performed to remove excessive the third material layer 710 to expose a top surface of the first material layer 280 in the second trenches 275.

Figure 17A:
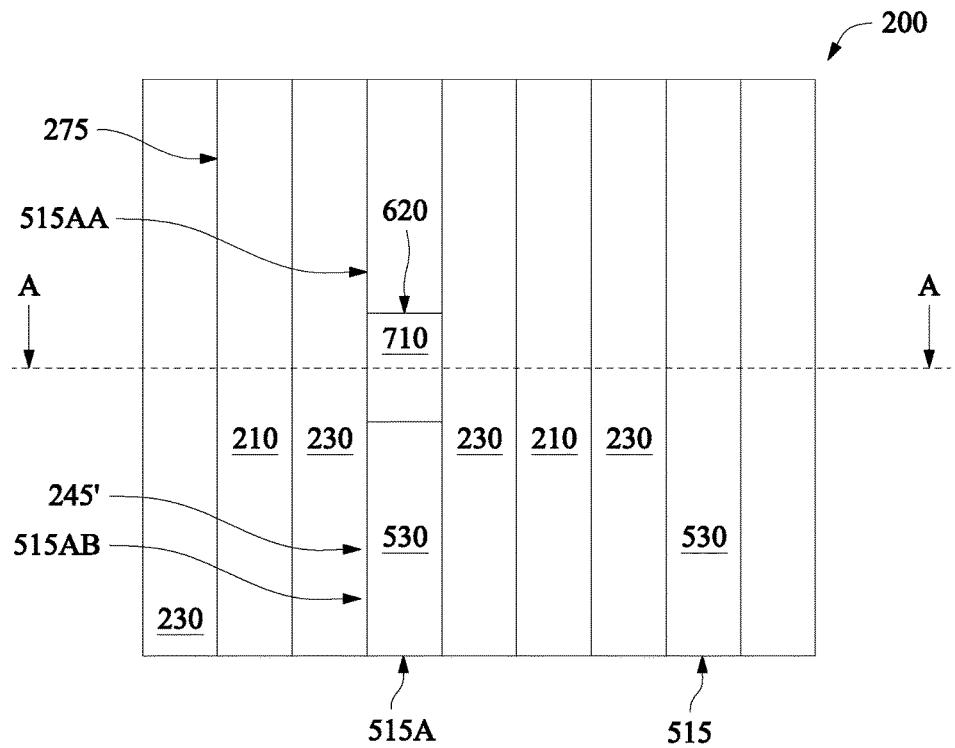
Figure 17B:
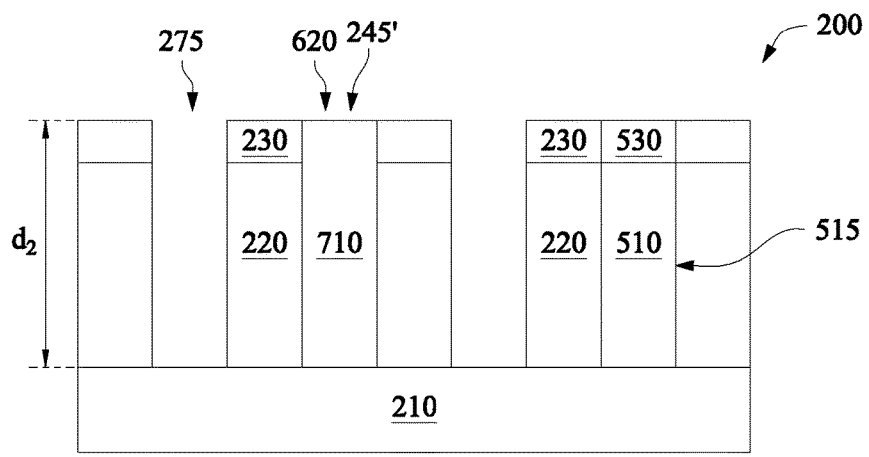

Referring to FIGS. 1, 17A, and 17B, method 100 proceeds to step 132 by removing the first material layer 280 to reveal the second trenches 275. The etch process may include a wet etch, a dry etch, and/or a combination thereof. The etch process is chosen to selectively etch the first material layer 280 without substantially etching the ESL 230, the capping layer 530 and the third material layer 710. In some embodiments, a wet etch process is performed by using corresponding etchant includes a mix of HCl, $FeCl_3$ and/or $H_2O$.

Figure 18A:
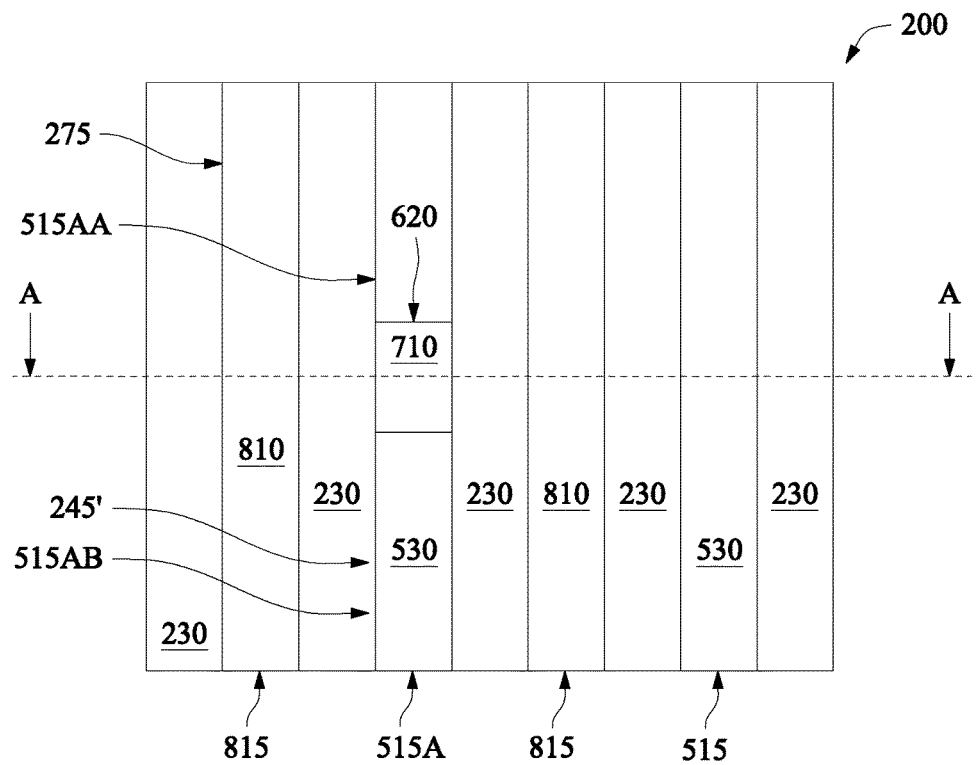
Figure 18B:
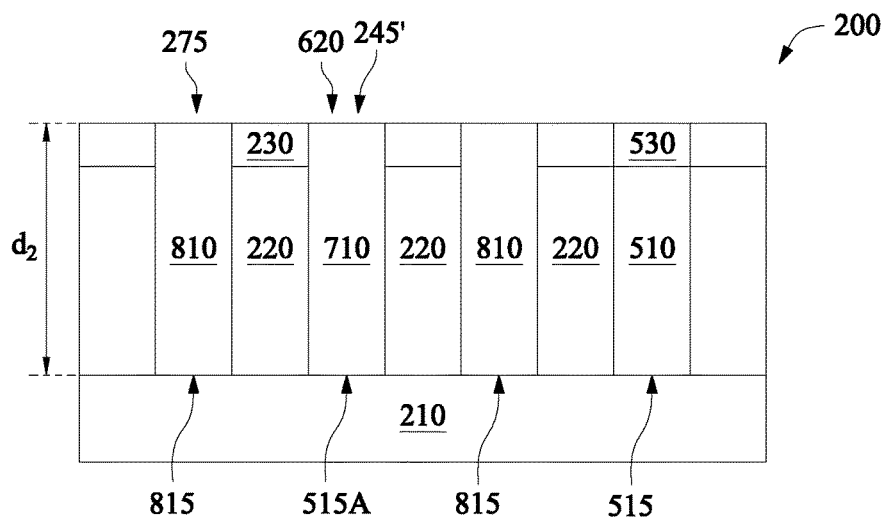

Referring to FIGS. 1, 18A, and 18B, method 100 proceeds to step 134 by filling in the second trenches 275 with the second metal layer 810 and recessing the excessive metal layer 810 to form second metal lines 815. The second metal layer 810 may be formed of the same metal material as the first metal layer 510 or may be formed of a different material. The second metal line 815 is formed similarly in many respects to the first the first metal line 515 discussed above association with FIGS. 10A-10B, including the materials discussed therein.

Figure 19A:
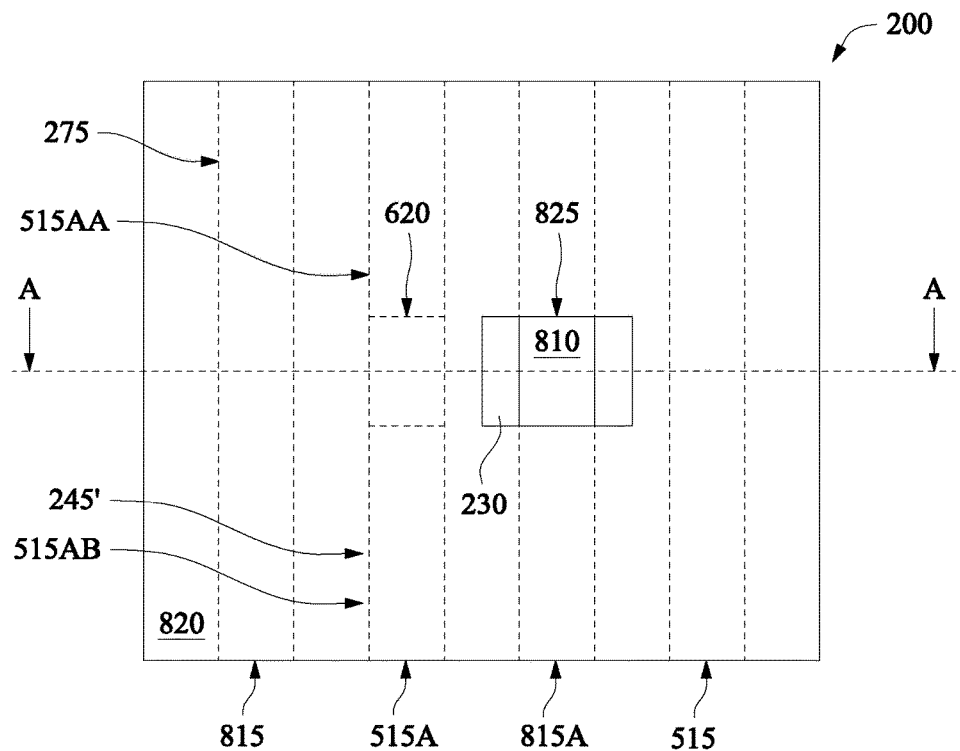
Figure 19B:
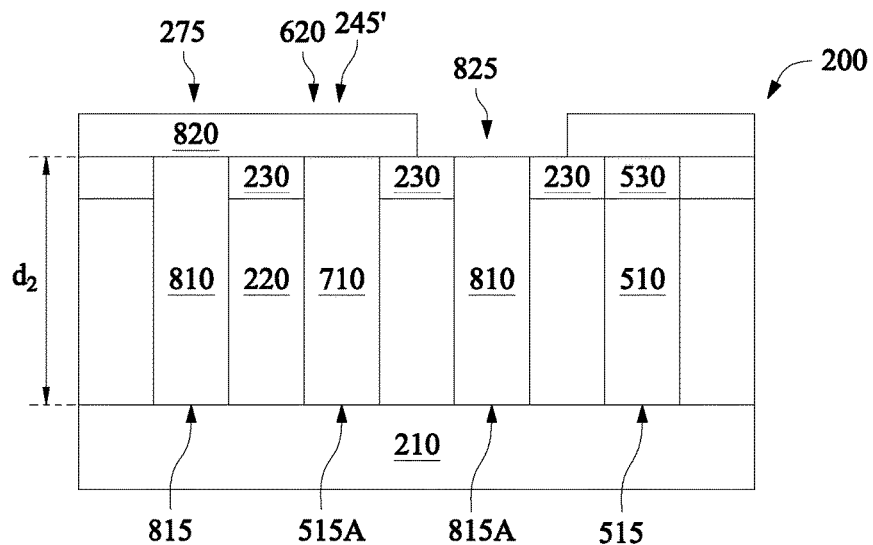

Referring to FIGS. 1, 19A, and 19B, method 100 proceeds to step 136 by forming a fourth patterned HM 820 over the ESL 230, the second metal lines 815 and the capping layer 530 over the first metal line 515. The fourth patterned HM layer 820 has a third opening 825 to expose a portion of a designated second metal line 815, referred to as 815A. In some embodiments, the second metal line 815A is adjacent to the first metal line 515A. The fourth patterned HM 820 is formed similarly in many respects to the third patterned HM 610 discussed above association with FIGS. 13A-13B.

Figure 19C:
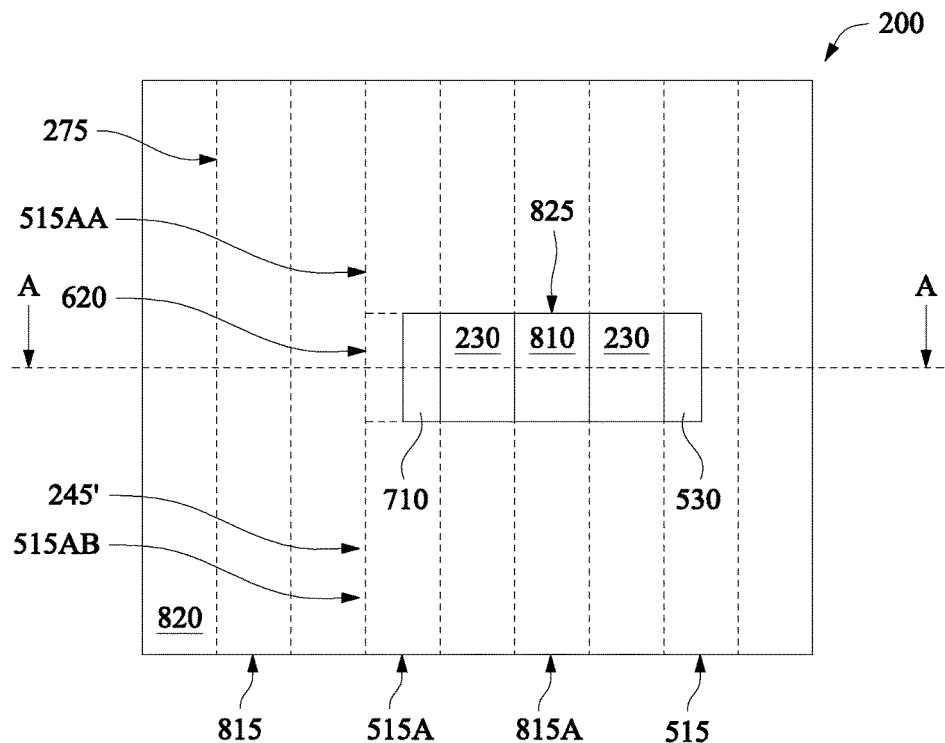
Figure 19D:
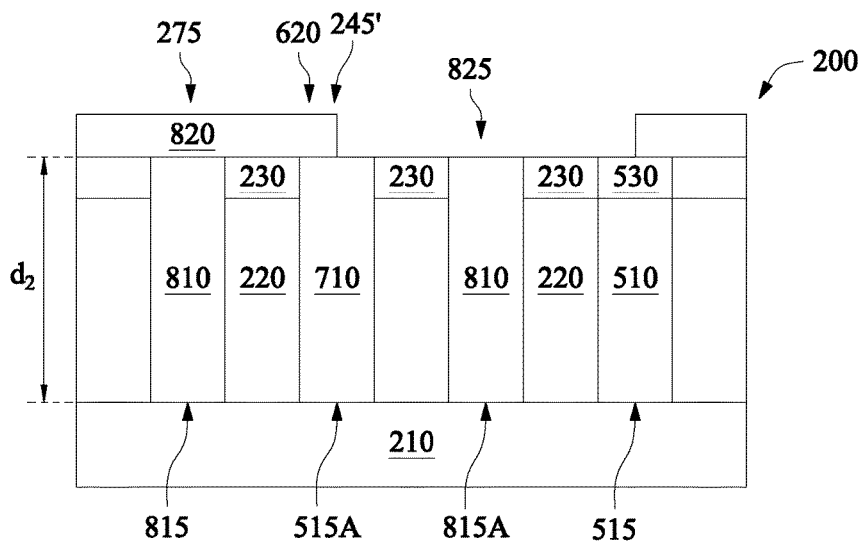

In some embodiments, not only the portion of the second metal line 815 is exposed within the third opening 825, but also an adjacent ESL 230 is exposed with the same third opening 825, as shown in FIGS. 19A and 19B. In some embodiments, the third opening 825 continually extends to the adjacent extended first trench 245' and adjacent first metal line 515 such that the adjacent ESL 230, a portion of the third material layer 710 (within the adjacent extended first trench 245') and a portion of the capping layer 530 (over the adjacent first metal line 515) are also exposed in the same third opening 825, as shown in FIGS. 19C-19D. Sometimes, it is designed that the third opening 825 having a larger width than a width of the second metal line 815A to obtain advantages, such as relaxing lithography process resolution constrains.

Referring to FIGS. 1 and 20A-20D, the method 100 proceeds to step 138 by removing a portion of the second metal line 815 through the third opening 825 to form a second cut 830. As shown, the second metal line 815A is cut into two second sub-metal lines, 815AA and 815AB. In the present embodiments, the etch process is chosen to selectively etch the second metal line 815A without substantially etching the ESL 230, the capping layer 530 and the third material layer 710. Thus, for circumstances where the adjacent ESL 230 is exposed within the same third opening 825 (as shown in FIGS. 19A-19B), or the ESL 230, the capping layer 530 and the third material layer 710 are exposed within the same third opening 825 (as shown in FIGS. 19D-19E), the exposed portions of the ESL 230, the capping layer 530 and the third material layer 710 serve as a sub-etch-mask. As a result, during the etch process, the first metal line 515 adjacent to the second metal line 815A is protected by the capping layer 530 when it is exposed within the third opening 825. This protection is important especially when the device 200 is scaled down such that the first metal line 515 becomes closer to the second metal line 815. The second metal line 815A is etched similarly in many respects to the etch process discussed above association with FIGS. 14A-14D.

Figure 20A:
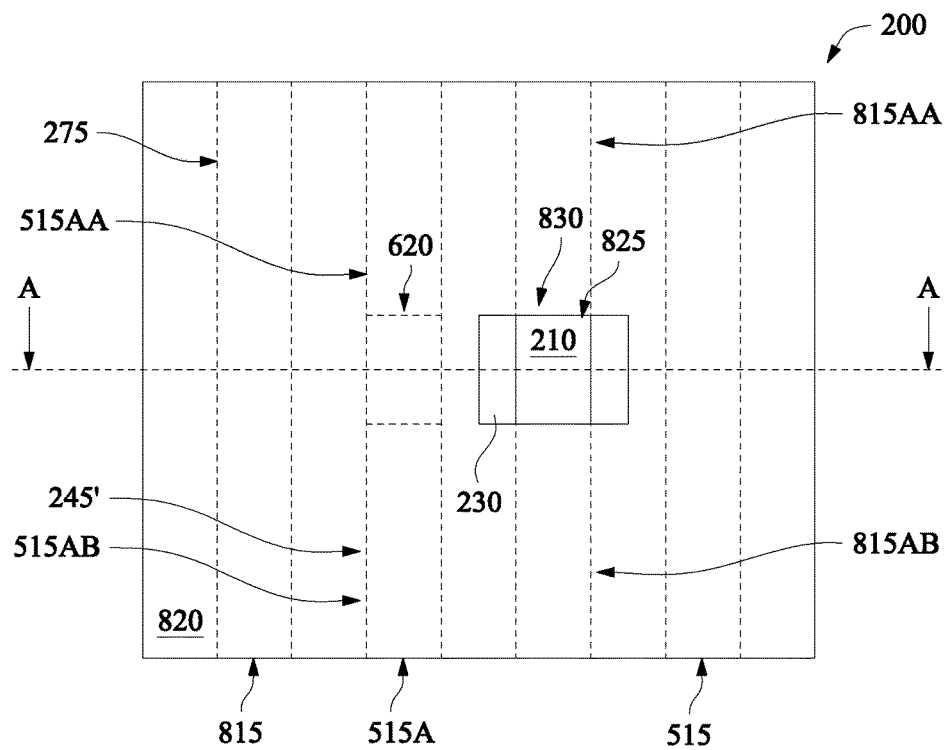
Figure 20B:
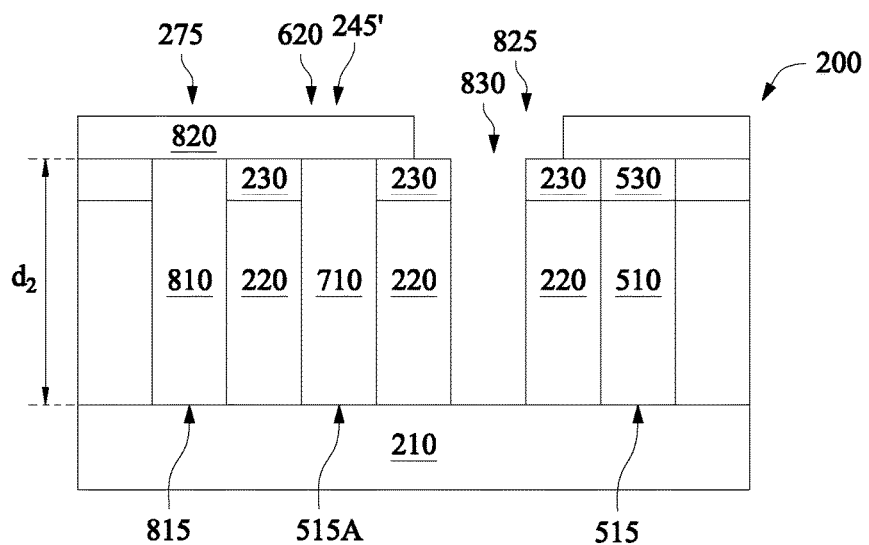
Figure 20C:
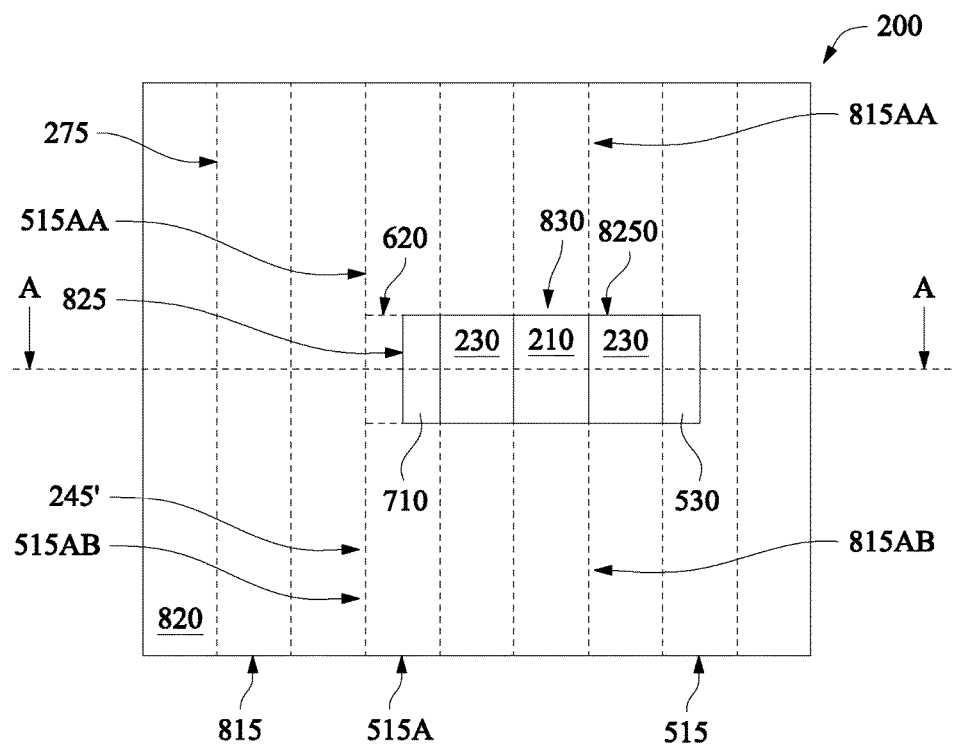
Figure 20D:
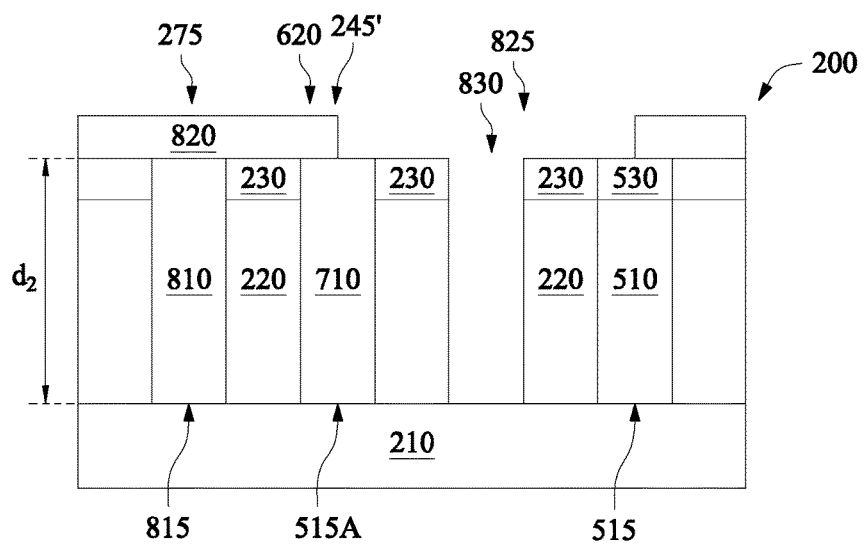
Figure 20E:
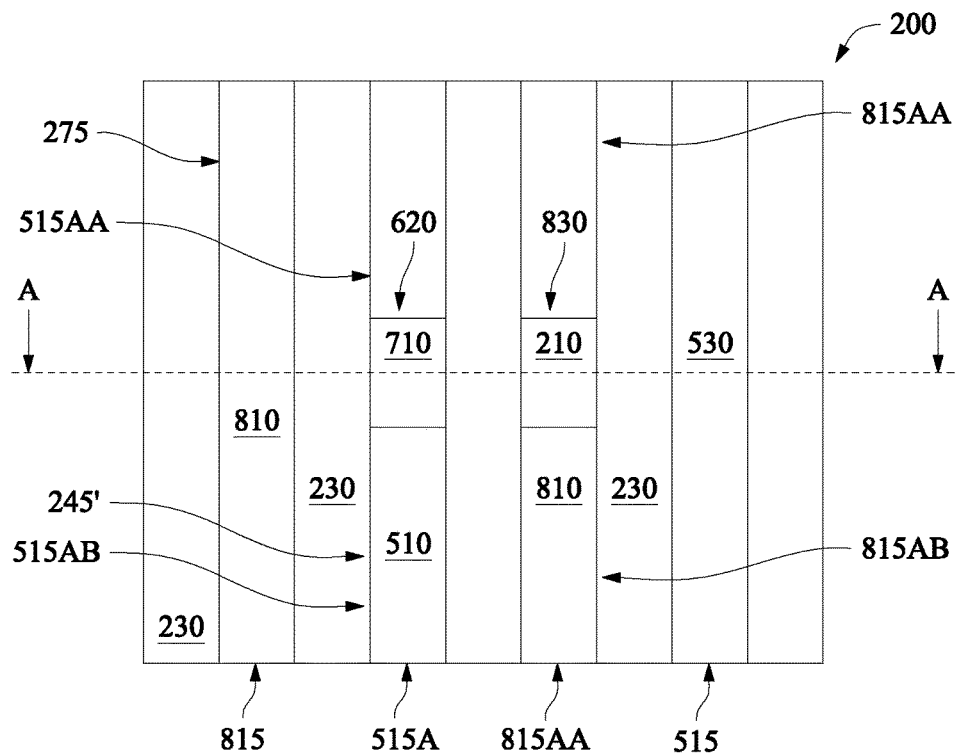
Figure 20F:
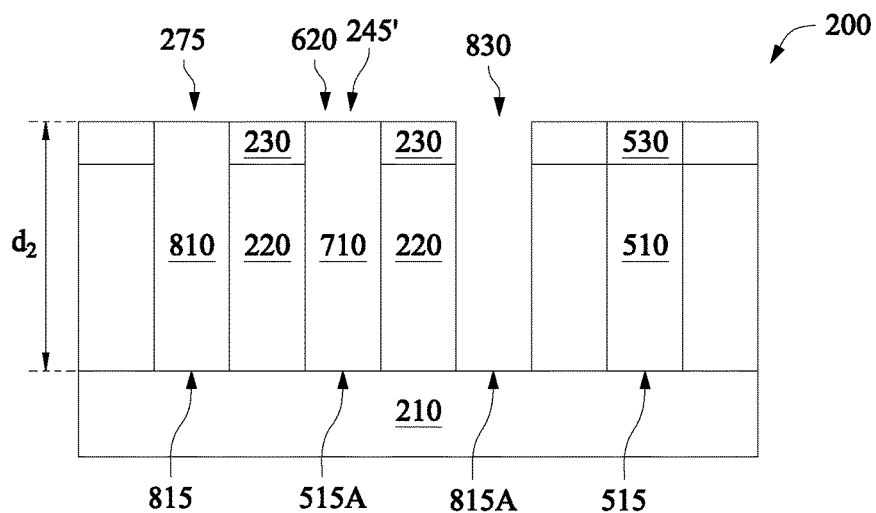

Referring to FIGS. 20E and 20F, after forming the second cut 830, the fourth patterned HM 820 is removed by an etch process. In one example where the fourth patterned HM 820 is a photoresist pattern, the fourth HM 820 is removed by wet stripping and/or plasma ashing. As shown, the second metal line 815A is cut into two second sub-metal lines, 815AA and 815AB, that are separated from each other by the second cut 830.

Figure 21A:
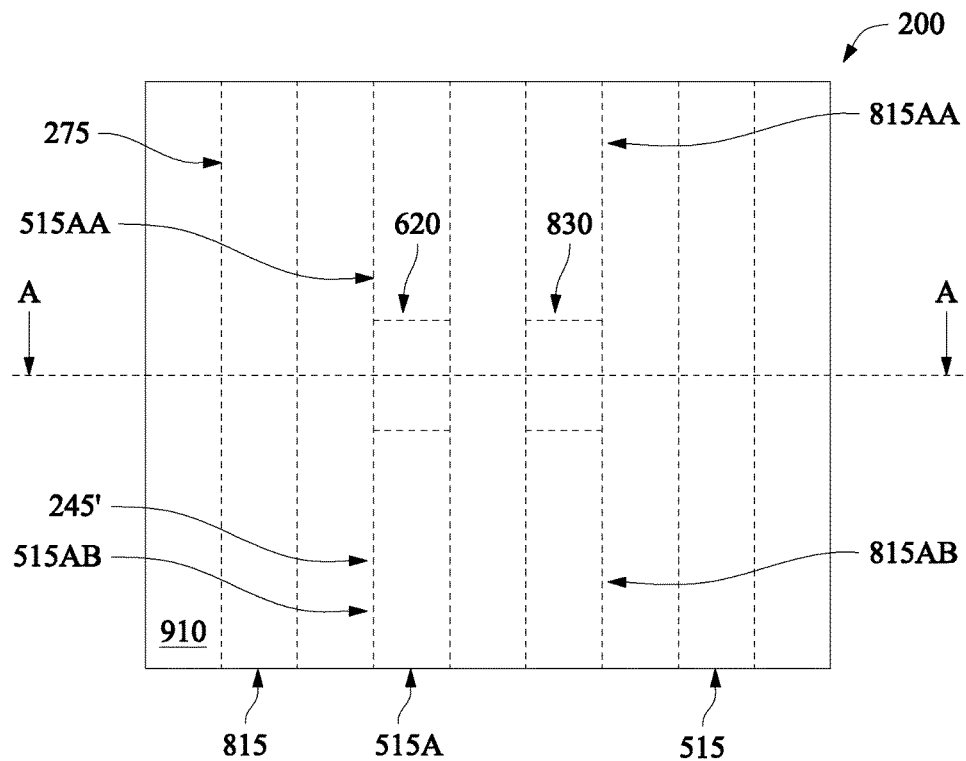
Figure 21B:
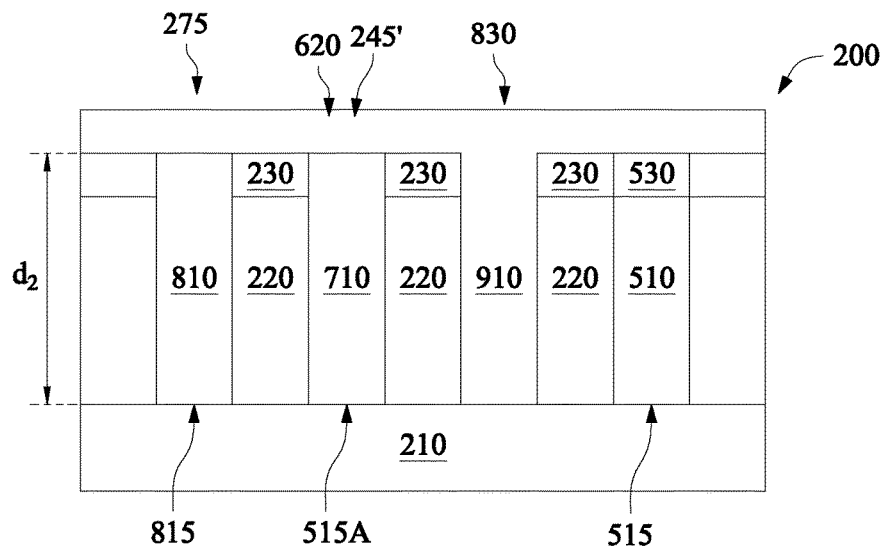

Referring to FIGS. 1 and 21A-21B, the method 100 proceeds to step 140 by filling in the second cut 830 with a fourth material layer 910. In the present embodiment, the fourth material layer 910 may be formed of the same metal material as the third material layer 710 or may be formed of a different material. The fourth material layer 910 is formed similarly in many respects to the third material layer 710 discussed above association with FIGS. 16A-16B, including the materials discussed therein.

Figure 22A:
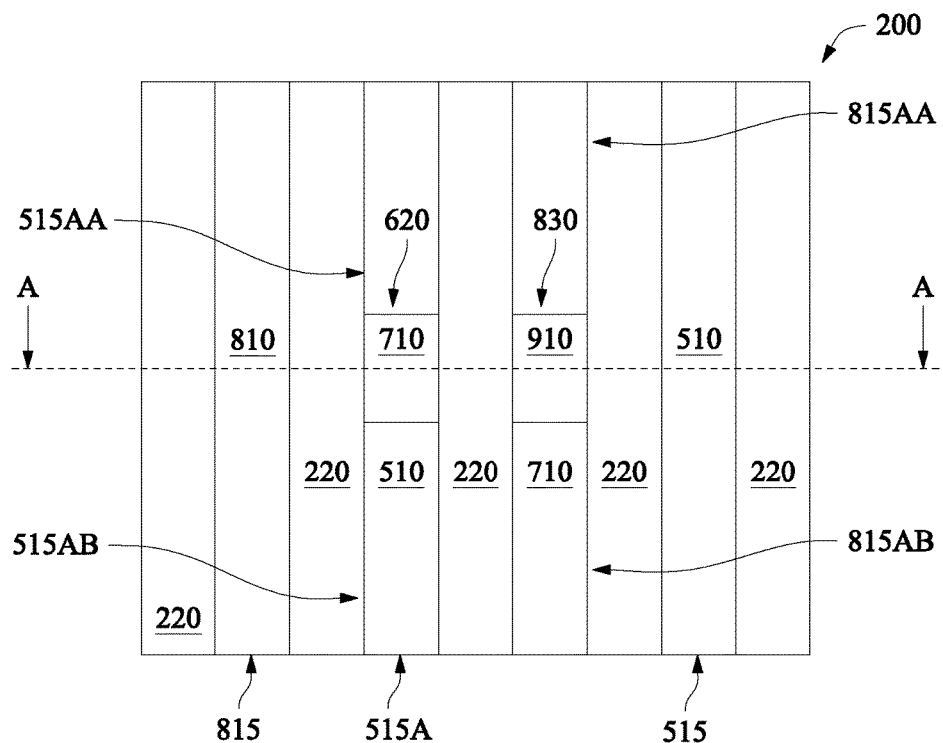
Figure 22B:
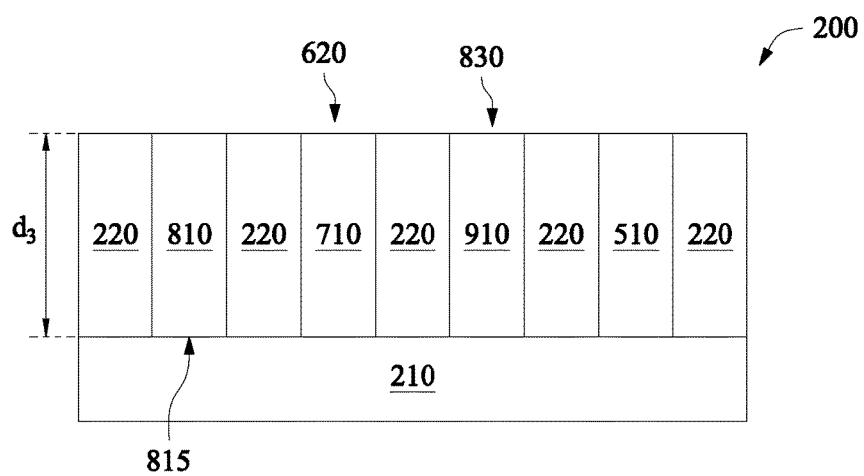

Referring to FIGS. 1 and 22A-22B, the method 100 proceeds to step 142 by recessing the fourth material layer 910 and removing the ESL 230 and the capping layer 530. The recess process planarizes the dielectric layer 220, the first and the second metal lines, 515 and 815, the third and fourth material layers, 710 and 910, to provide a planar topography. In some embodiment, the recess process is a chemical-mechanical polishing (CMP) process. As shown, the first and second metal lines, 515 and 815 are parallel to each other and separated by the dielectric layer 220. One of the first metal line, namely 515A, is cut into two first sub-metal lines, 515AA and 515AB, and separated from each other by the third material layer 710. One of the second metal lines, namely 815A, is cut into two second sub-metal lines, 815AA and 815AB, and separated from each other by the fourth material layer 910.

Additional steps can be provided before, during, and after method 100 and some of the steps described can be replaced, eliminated, and/or moved around for additional embodiments of method 100. Other alternatives or embodiments may present without departure from the spirit and scope of the present disclosure.

Based on the above, it can be seen that the present disclosure provides methods of cutting metal line with a self-alignment nature. This relaxes process constrains and reduces adverse process impacts, such as such as overlay allowance and misalignment in a lithography process. The method also employs reducing trench depths for relaxing gap-filling constrain in the metal deposition process. The method provides a robust integration for cutting metal line.

The present disclosure provides many different embodiments of fabricating a semiconductor device that provide one or more improvements over existing approaches. In one embodiment, a method for fabricating a semiconductor device includes forming a dielectric layer over a substrate, forming an etch-stop-layer (ESL) over the dielectric layer, forming a first patterned hard mask (HM) defining a first trench over the ESL, forming a second trench extending through the ESL and the dielectric layer. The second trench is adjacent the first trench. The method also includes filling in the first trench and the second trench with a first material layer, extending the first trench through the ESL and the dielectric layer while the first material layer is filled in the second trench to form an extended first trench, forming a first metal line within the extended first trench, forming a capping layer over the first metal line and removing a portion of the first metal line to form a first cut by using the ESL and the first material layer as an etch mask.

In another embodiment, a method includes forming a dielectric layer over a substrate, forming an etch-stop-layer (ESL) over the dielectric layer, forming a first trench in the ESL and extending into the dielectric layer, forming a first material layer in the first trench, forming a second trench in the ESL and extending into the dielectric layer while the first trench is filled with the first material layer, forming a first metal line within the second trench while the first material layer remains within the first trench, forming a capping layer over the first metal line, removing a portion of the capping layer and a portion of the first metal line to form a first cut by using the ESL and the first material layer as an etch mask, filling in the first cut with a second material layer, removing the first material layer from the first trench, forming a second metal line within the first trench and removing a portion of the second metal line to form a second cut by using the ESL, a portion of the capping layer and a portion of the second material layer as an etch mask.

In yet another embodiment, a device includes forming a dielectric layer over a substrate, forming an etch-stop-layer (ESL) over the dielectric layer, forming a first patterned hard mask (HM) defining a first trench over the ESL, forming a second trench extending through the ESL and the dielectric layer, filling in the first trench and the second trench with a first material layer, extending first trench through the ESL and the dielectric layer to form an extended first trench. The first material layer is filled in the second trench during the extending of the first trench through the ESL and the dielectric layer to form the extended first trench. The method also includes forming a first metal line within the extended first trench, forming a capping layer over the first metal line, removing a portion of the capping layer and a portion of the first metal line to form a first cut by using the ESL and the first material layer as an etch mask, filling in the first cut with a second material layer, removing the first material layer from the second trench while the first metal line with the capping layer remains within the extended first trench, forming a second metal line within the second trench and removing a portion of the second metal line to form a second cut by using the ESL, a portion of the capping layer and a portion of the second material layer as an etch mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over a substrate;
   forming an etch-stop-layer (ESL) over the dielectric layer;
   forming a first patterned hard mask (HM) defining a first trench over the ESL;
   forming a second trench extending through the ESL and the dielectric layer, wherein the second trench is adjacent the first trench;
   filling in the first trench and the second trench with a first material layer;
   extending the first trench through the ESL and the dielectric layer while the first material layer is filled in the second trench to form an extended first trench;
   forming a first metal line within the extended first trench;
   forming a capping layer over the first metal line; and
   removing a portion of the first metal line to form a first cut by using the ESL and the first material layer as an etch mask.

2. The method of claim 1, wherein forming the second trench extending through the ESL and the dielectric layer includes:
   forming a second patterned HM over the ESL;
   selectively etching the ESL and the dielectric layer through the second patterned HM; and
   removing the second patterned HM.

3. The method of claim 1, wherein extending the first trench through the ESL and the dielectric layer includes:
   removing the first material layer from the first trench and partially removing first material layer in the second trench; and
   selectively etching the ESL and the dielectric layer without substantially etching the first patterned HM and the first material layer in the second trench.

4. The method of claim 1, wherein forming first metal line within the extended first trench includes:
   filling in the extended first trench with a second material layer;
   recessing the second material layer and the first patterned HM to reduce a depth of the extended first trench;
   selectively removing the second material layer to reveal the extended first trench;
   filling the extended first trench with a metal layer; and
   recessing excessive metal layer.

5. The method of claim 1, wherein removing the portion of the first metal line to form the first cut includes:
   forming a first patterned photoresist layer having a first opening over the first metal line, wherein the ESL adjacent to the first metal line is exposed within the first opening, wherein a portion of the first material layer in the second trench is exposed within the first opening; and
   selectively etching the first metal line through the first opening.

6. The method of claim 1, wherein forming the capping layer over the first metal line includes:
recessing the first metal line to form a sub-trench;
filling in the sub-trench with the capping layer; and
recessing the capping layer.

7. The method of claim 1, further comprising:
after forming the first cut, filling in the first cut with a third material layer;
removing the first material layer to reveal the second trench;
forming a second metal line within the second trench; and
removing a portion of the second metal line to form a second cut by using the ESL, the capping layer over the first metal line and the third material layer as an etch mask.

8. The method of claim 7, wherein removing the portion of the second metal line to form the second cut includes:
forming a second patterned photoresist layer having a second opening over the second metal line, wherein the ESL adjacent to the second metal line is exposed within the same second opening, wherein a portion of the capping layer over the first metal line is exposed within the same second opening, wherein a portion of the third material layer in the first cut is exposed within the same second opening; and
selectively etching the second metal line through the second opening.

9. A method comprising:
forming a dielectric layer over a substrate;
forming an etch-stop-layer (ESL) over the dielectric layer;
forming a first trench in the ESL and extending into the dielectric layer;
forming a first material layer in the first trench;
forming a second trench in the ESL and extending into the dielectric layer while the first trench is filled with the first material layer;
forming a first metal line within the second trench while the first material layer remains within the first trench;
forming a capping layer over the first metal line;
removing a portion of the capping layer and a portion of the first metal line to form a first cut by using the ESL and the first material layer as an etch mask;
filling in the first cut with a second material layer;
removing the first material layer from the first trench;
forming a second metal line within the first trench; and
removing a portion of the second metal line to form a second cut by using the ESL, a portion of the capping layer and a portion of the second material layer as an etch mask.

10. The method of claim 9, wherein forming the first trench in the ESL and extending into the dielectric layer includes:
forming a first patterned hard mask (HM) layer having a plurality of sub-trenches over the ESL;
forming a second patterned hard mask (HM) layer to expose a first subgroup of the sub-trenches;
selectively etching the ESL and the dielectric layer through the second patterned HM layer; and
removing the second patterned HM layer.

11. The method of claim 10, wherein forming the second trench in the ESL and extending into the dielectric layer includes:
extending a second group of the sub-trench through the ESL and the dielectric layer by using the first patterned HM layer and the first material layer as an etch mask.

12. The method of claim 10, wherein forming the first metal line within the second trench includes:
filling in the second trench with a third material layer;
recessing the third material layer and the first patterned HM to reduce a depth of the second trench;
selectively removing the second material layer to reveal the second trench;
filling the second trench with a first metal layer; and
recessing excessive first metal layer.

13. The method of claim 9, wherein removing the portion of the first metal line to form the first cut includes:
forming a first patterned photoresist layer having a first opening over the first metal line, wherein the ESL adjacent to the first metal line is exposed within the first opening, wherein a portion of the first material layer in the first trench is exposed within the first opening; and
selectively etching the first metal line through the first opening.

14. The method of claim 9, wherein forming the capping layer over the first metal line includes:
recessing a top portion of the first metal line;
depositing the capping layer over the recessed first metal line; and
recessing the capping layer.

15. The method of claim 9, wherein removing the portion of the second metal line to form the second cut includes:
forming a second patterned photoresist layer having a second opening over the second metal line, wherein the ESL adjacent to the second metal line is exposed within the same second opening, wherein a portion of the capping layer over the first metal line is exposed within the same second opening, wherein a portion of the second material layer in the first cut is exposed within the same second opening; and
selectively etching the second metal line through the second opening.

16. A method comprising:
forming a dielectric layer over a substrate;
forming an etch-stop-layer (ESL) over the dielectric layer;
forming a first patterned hard mask (HM) defining a first trench over the ESL;
forming a second trench extending through the ESL and the dielectric layer;
filling in the first trench and the second trench with a first material layer;
extending first trench through the ESL and the dielectric layer to form an extended first trench, wherein the first material layer is filled in the second trench during the extending of the first trench through the ESL and the dielectric layer to form the extended first trench;
forming a first metal line within the extended first trench;
forming a capping layer over the first metal line;
removing a portion of the capping layer and a portion of the first metal line to form a first cut by using the ESL and the first material layer as an etch mask;
filling in the first cut with a second material layer;
removing the first material layer from the second trench while the first metal line with the capping layer remains within the extended first trench;
forming a second metal line within the second trench; and
removing a portion of the second metal line to form a second cut by using the ESL, a portion of the capping layer and a portion of the second material layer as an etch mask.

17. The method of claim 16, wherein forming first metal line within the extended first trench includes:
filling in the extended first trench with a third material layer;

recessing the third material layer and the first patterned HM to reduce a depth of the extended first trench;

removing the third material layer to reveal the extended first trench with the reduced depth;

filling the extended first trench with the reduced depth with a first metal layer; and recessing the first metal layer.

18. The method of claim 16, wherein removing the portion of the capping layer and the respective first metal line to form the first cut includes:

forming a first patterned photoresist layer having a first opening over the first metal line, wherein the ESL adjacent to the first metal line is exposed within the same first opening, wherein a portion of the first material layer in the second trench is exposed within the same first opening; and selectively etching the first metal line through the first opening.

19. The method of claim 16, wherein removing the portion of the second metal line to form the second cut includes:

forming a second patterned photoresist layer having a second opening over the second metal line, wherein the ESL adjacent to the second metal line is exposed within the same second opening, wherein a portion of the capping layer over the first metal line is exposed within the same second opening, wherein a portion of the second material layer in the first cut is exposed within the same second opening; and selectively etching the second metal line through the second opening.

20. The method of claim 16, wherein forming the second trench extending through the ESL and the dielectric layer includes:

forming a second patterned hard mask (HM) over the ESL;

etching the ESL and the dielectric layer through the second patterned HM; and removing the second patterned HM.

\* \* \* \* \*